US011908903B2

(12) United States Patent
Kao et al.

(10) Patent No.: US 11,908,903 B2
(45) Date of Patent: Feb. 20, 2024

(54) PROCESS WINDOW CONTROL FOR GATE FORMATION IN SEMICONDUCTOR DEVICES

(71) Applicant: Taiwan Semiconductor Manufacturing Company Limited, Hsinchu (TW)

(72) Inventors: Kuei-Yu Kao, Hsinchu (TW); Shih-Yao Lin, New Taipei (TW); Chen-Ping Chen, Toucheng Township (TW); Chih-Han Lin, Hsinchu (TW); Ming-Ching Chang, Hsinchu (TW); Chao-Cheng Chen, Hsin-Chu (TW)

(73) Assignee: TAIWAN SEMICONDUCTOR MANUFACTURING COMPANY LIMITED, Hsinchu (TW)

( * ) Notice: Subject to any disclaimer, the term of this patent is extended or adjusted under 35 U.S.C. 154(b) by 298 days.

(21) Appl. No.: 17/370,750

(22) Filed: Jul. 8, 2021

(65) Prior Publication Data

US 2023/0008921 A1    Jan. 12, 2023

(51) Int. Cl.
*H01L 29/40* (2006.01)
*H01L 29/66* (2006.01)
*H01L 29/06* (2006.01)
*H01L 29/423* (2006.01)

(52) U.S. Cl.
CPC ........ *H01L 29/401* (2013.01); *H01L 29/0665* (2013.01); *H01L 29/42392* (2013.01); *H01L 29/66484* (2013.01); *H01L 29/66545* (2013.01)

(58) Field of Classification Search
CPC ............... H01L 29/401; H01L 29/0665; H01L 29/42392; H01L 29/66484; H01L 29/66545; H01L 21/823481; H01L 27/088; H01L 29/0673; H01L 29/66439; H01L 29/78696; H01L 29/775; H01L 29/1033; H01L 29/42356; H01L 29/66795; H01L 29/785; B82Y 10/00
USPC ........................................ 438/284
See application file for complete search history.

(56) References Cited

U.S. PATENT DOCUMENTS

| 2015/0255567 A1* | 9/2015 | Basu | H01L 29/205 |
| | | | 257/192 |
| 2016/0071934 A1* | 3/2016 | Cea | H01L 29/785 |
| | | | 257/192 |

* cited by examiner

*Primary Examiner* — Tong-Ho Kim
(74) *Attorney, Agent, or Firm* — FOLEY & LARDNER LLP

(57) ABSTRACT

A method of fabricating a semiconductor structure includes selective use of a cladding layer during the fabrication process to provide critical dimension uniformity. The cladding layer can be formed before forming a recess in an active channel structure or can be formed after filling a recess in an active channel structure with dielectric material. These techniques can be used in semiconductor structures such as gate-all-around (GAA) transistor structures implemented in an integrated circuit.

20 Claims, 29 Drawing Sheets

PROCESS WINDOW CONTROL FOR GATE FORMATION IN SEMICONDUCTOR DEVICES

BACKGROUND

The present disclosure generally relates to semiconductor devices and methods for fabricating semiconductor devices, and particularly to providing critical dimension uniformity through the semiconductor fabrication process. As semiconductor devices continue to decrease in size, challenges may arise in terms of consistencies in the fabrication process. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
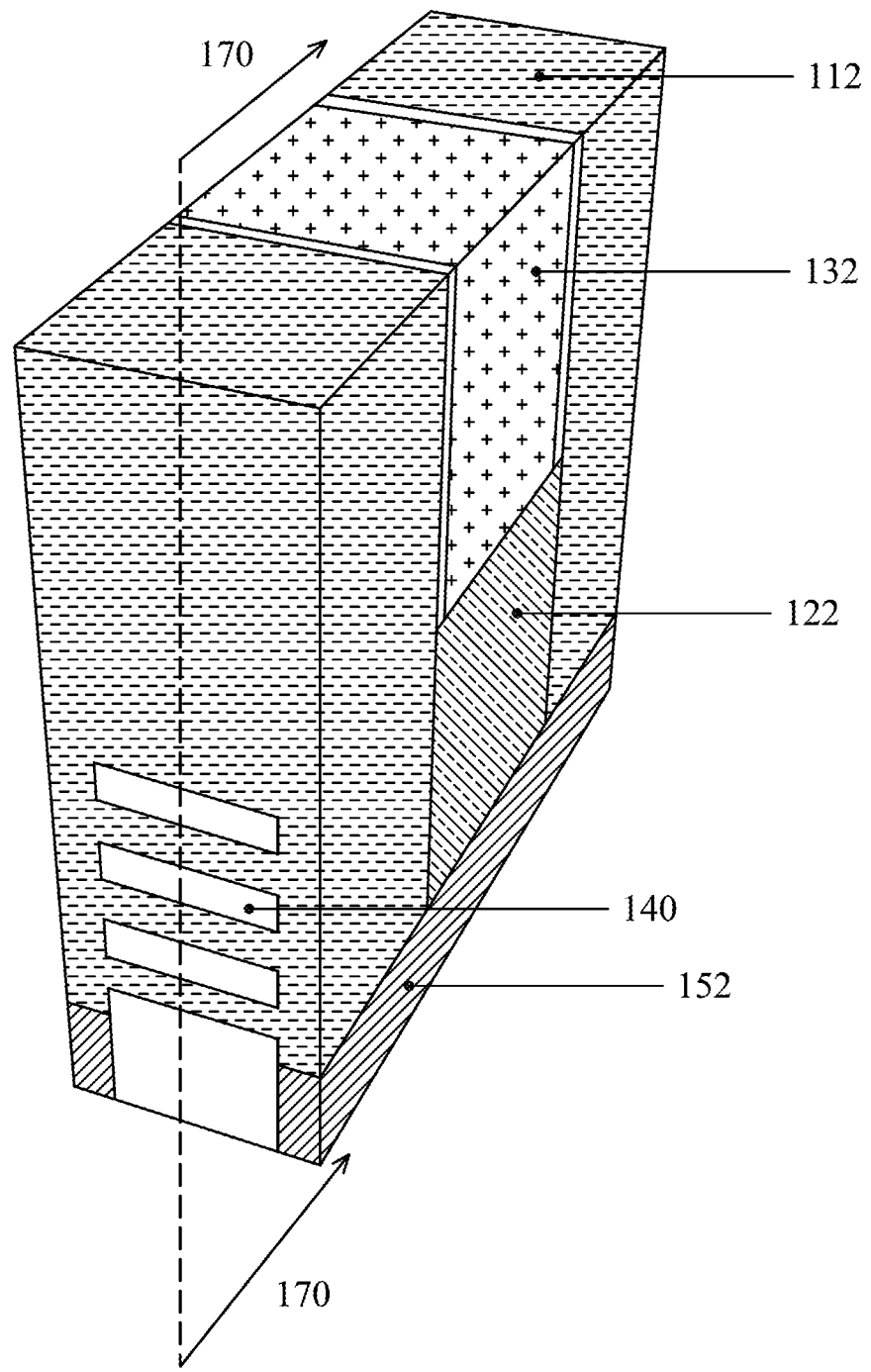
FIG. 1A is a perspective view of an example semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides techniques for providing critical dimension uniformity in semiconductor structures such as gate-all-around field-effect transistor (GAAFET) structures through elective use of a cladding layer. The cladding layer can be formed before forming a recess in an active channel structure or can be formed after filling a recess in an active channel structure with dielectric material. The cladding layer can be selectively used to provide consistent and larger process windows for forming gate structures in an integrated circuit.

Figure 1B:
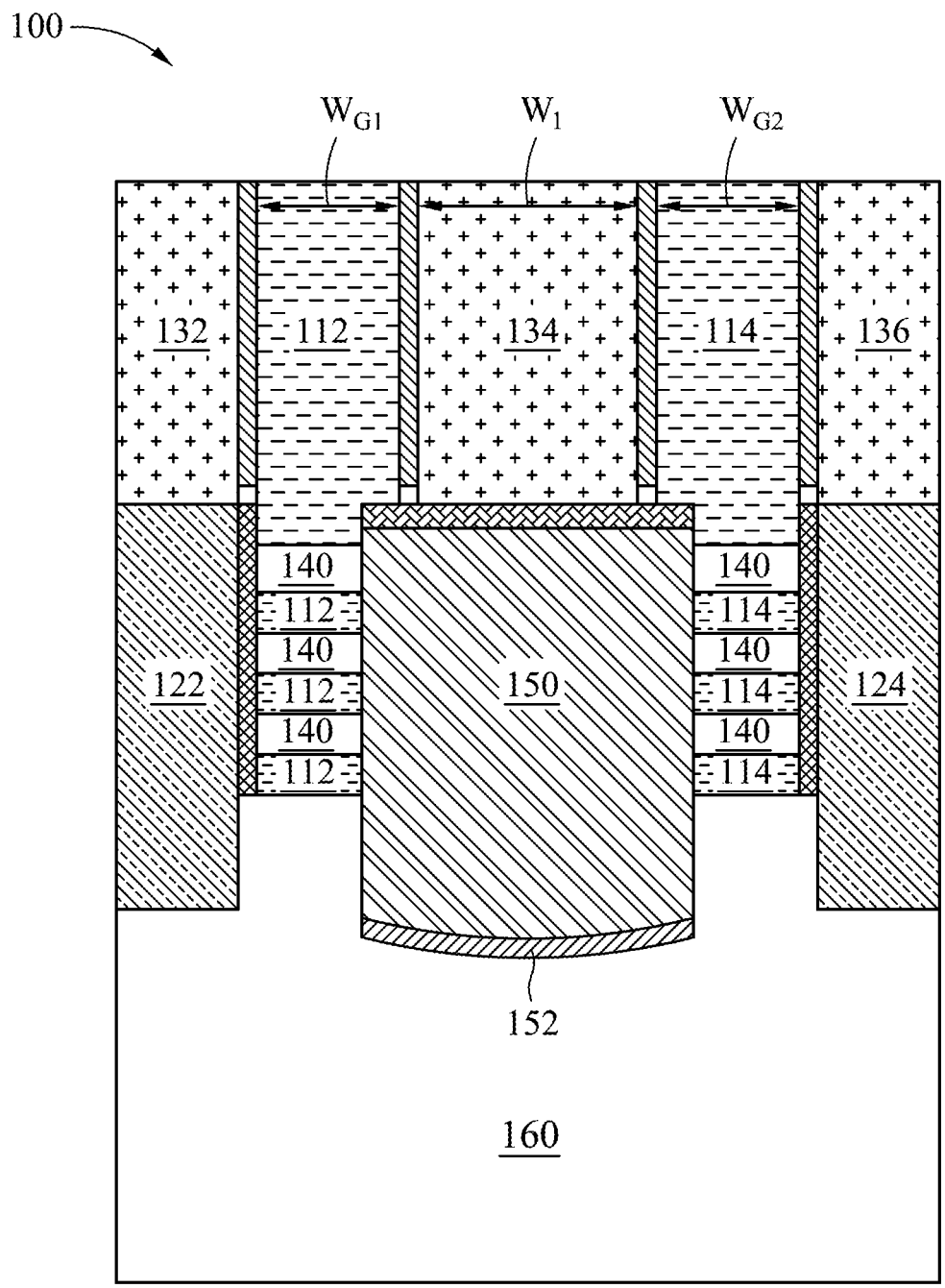
FIG. 1B is a cross section of the example semiconductor structure of FIG. 1A, in accordance with some embodiments.

Referring now to FIG. 1A, a perspective view of an example semiconductor structure 100 is shown, in accordance with some embodiments. Semiconductor structure 100 generally includes a plurality of gate-all around transistor structures. These structures are sometimes referred to as surrounding-gate transistor (SGT) structures. The gate-all around transistor structures can generally allow for formation of smaller transistor structures and therefore smaller and more compact integrated circuits when compared to some alternative approaches such as fin field-effect transistor (FinFET) structures. It will be appreciated that the approaches described herein can be applicable to other types of semiconductor structures beyond gate-all-around transistor structures as well. Referring now to FIG. 1B, a cross section of semiconductor structure 100 cut from cross section 170 illustrated in FIG. 1A is shown, in accordance with some embodiments.

Semiconductor structure 100 is shown to include a gate structure 112 and a gate structure 114. Gate structure 112 and gate structure 114 can both be implemented as metal gate structures, such as high-k metal gate (HKMG) structures. In such implementations, a stack including conductive metal material and dielectric material with a high dielectric constant (high-k) is formed. The stack can also include a work function layer, a capping layer, and/or other layers to form a suitable HKMG structure for the intended application. The HKMG structure can be formed using a variety of suitable processes, including both gate-first and gate-last implementations. Gate structure 112 and gate structure 114 are disposed in generally parallel relation, and can be part of a parallel gate stack that includes additional, similar gate structures not shown in FIG. 1B. In some applications, the use of a HKMG structure as compared to the use of a polysilicon gate can provide reduced charge leakage and thereby improved performance. However, it will be appreciated that the techniques described herein can also be applied to semiconductor devices with polysilicon gate structures, among other types of gate structures.

Semiconductor structure 100 is also shown to include an epitaxial region 122 and an epitaxial region 124. Epitaxial region 122 and epitaxial region 124 generally serve as source and drain terminals for individual gate-all around transistor structures. Epitaxial region 122 and epitaxial region 124 are generally crystalline structures that can be formed using epitaxial growth processes such as vapor-phase epitaxy (VPE), molecular-beam epitaxy (MBE), liquid-phase epitaxy (LPE), and other suitable processes and combinations thereof. Epitaxial region 122 and epitaxial region 124 can be doped using suitable dopants, including both n-type and p-type dopants such as arsine, phosphine, diborane, and other suitable dopants and combinations thereof.

Semiconductor structure 100 is also shown to include an insulating layer 132, an insulating layer 134, and an insulating layer 136. Each of insulating layer 132, insulating layer 134, and insulating layer 136 can be implemented as inter-layer dielectric (ILD) structures, for example. Insulating layer 132, insulating layer 134, and insulating layer 136 can also be implemented as contact etch stop layers (CESL). Insulating layer 132, insulating layer 134, and insulating layer 136 can be formed using materials such as silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof.

Semiconductor structure 100 is also shown to include a plurality of active channel structures 140. In some embodiments, active channel structures 140 are implemented as nanosheets that are surrounded by gate 112, gate 114, epitaxial region 122, and epitaxial region 124. However, active channel structures 140 can also be implemented using alternative approaches, including used of rounded nanowires. Active channel structures 140 are generally formed using silicon, however active channel structures 140 can also be implemented using other suitable materials and combinations thereof.

Semiconductor structure 100 is also shown to include a dielectric region 150. Dielectric region 150 is formed adjacent gate 112 and gate 114, and can be used during the fabrication process along with the cladding layers described below to provide critical dimension uniformity within semiconductor structure 100. Dielectric region can be formed using materials such as silicon dioxide, silicon oxynitride, silicon nitride, silicon carbon nitride, silicon oxycarbonitride, hafnia, tantalum nitride, and other suitable materials and combinations thereof.

Semiconductor structure 100 is also shown to include a substrate 160. Substrate 160 can be implemented as an n-type substrate or a p-type substrate. For example, substrate 160 can be formed of silicon material (e.g. crystalline silicon) that is doped with an n-type dopant such as arsenic, phosphorous, and other similar dopants. Substrate 160 can also be doped with p-type dopants such as boron and other similar dopants. Substrate 160 can be implemented using a silicon-on-insulator structure, a silicon-on-sapphire structure, and various other suitable materials and combinations thereof.

Semiconductor structure 100 is also shown to include an isolation structure 152. Isolation structure 152 can generally prevent leakage of electric current between components of semiconductor structure 100. Isolation structure 152 can be implemented as a shallow trench isolation (STI) structure, for example. Isolation structure 152 can be formed by creating trenches within substrate 160, filling the trenches with insulating material, and removing excess insulating material using processes such as chemical-mechanical polishing (CMP). Isolation structure 152 can generally provide a base for forming other components of semiconductor structure 100 thereon.

In FIG. 1B, the variable $W_{G1}$ denotes the width of gate 112, the variable $W_{G2}$ denotes the width of gate 114, and the variable $W_1$ denotes the width of insulating layer 134. Through selective use of a cladding layer during the fabrication process (such as described below with respect to process 200 and process 300), the width $W_{G1}$ can be made equal to the width $W_{G2}$. In some embodiments, the widths $W_{G1}$ and $W_{G2}$ may be substantially equal, such as within 5% of each other or within 10% of each other. This critical dimension uniformity can provide advantages in terms of semiconductor device yield and semiconductor device performance, especially in applications with smaller node sizes. Moreover, the widths $W_{G1}$ and $W_{G2}$ can be made smaller than the width $W_1$.

It will be appreciated that semiconductor structure 100 can include a variety of additional layers and materials not explicitly described herein. For example, spacer structures such as spacer structures with a high dielectric constant (high-k) can be formed around gate 112 and gate 114 to provide electrical isolation of gate 112 and gate 114. Moreover, additional dielectric layers can be formed in various other locations within semiconductor structure 100.

Figure 1C:
FIGS. 1C-1D are perspective top views of the semiconductor structure of FIG. 1A during the fabrication process, in accordance with some embodiments.
Figure 1D:
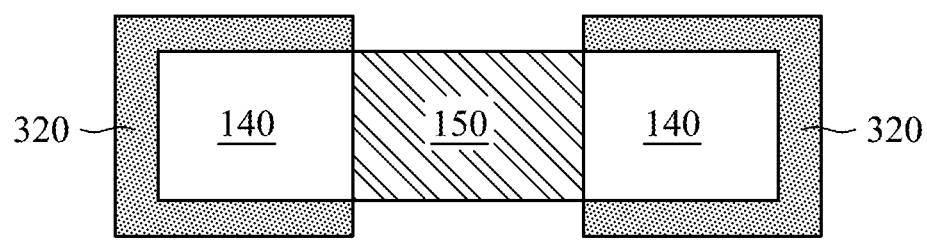

Referring now to FIG. 1C and FIG. 1D, two perspective top views of semiconductor structure 100 during the fabrication process are shown, in accordance with some embodiments. In FIG. 1C, a cladding layer 220 is formed adjacent a first side of active channel 140, a second side of active channel 140, and a third side of active channel 140, but not around a fourth side of active channel 140. Cladding layer 220 can generally be formed of silicon germanium (SiGe) or other suitable materials, as discussed in more detail below. In FIG. 1D, a cladding layer 320 is likewise formed adjacent a first side of active channel 140, a second side of active channel 140, and a third side of active channel 140, but not around a fourth side of active channel 140. In FIG. 1D, dielectric region 150 is also formed within active channel 140. Cladding layer 320 can also be formed of silicon germanium or other suitable materials, as discussed in more detail below. The top views provided in FIG. 1C and FIG. 1D illustrate the selective use of cladding layer 220 and cladding layer 320, respectively, that can provide critical dimension uniformity.

Figure 2A:
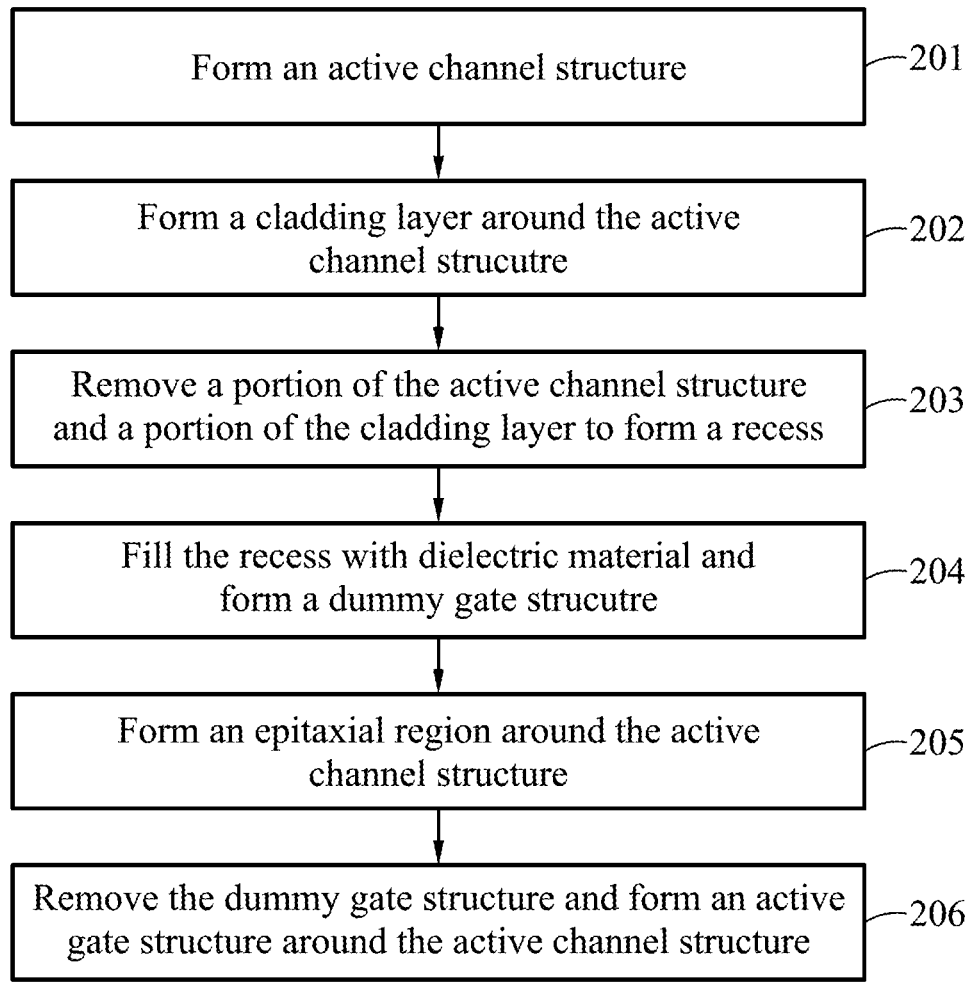
FIG. 2A is a flow diagram illustrating an example process for fabricating the semiconductor structure of FIG. 1A, in accordance with some embodiments.

Referring now to FIG. 2A, a flow diagram illustrating an example process 200 for fabricating semiconductor structure 100 is shown, in accordance with some embodiments. FIGS. 2B-2M illustrate cross sections of semiconductor structure 100 at various steps of process 200. FIG. 2B, FIG. 2D, FIG. 2F, FIG. 2H, FIG. 2J, and FIG. 2L illustrate cross sections of semiconductor structure 100 cut in a horizontal direction (e.g. x-direction as cut from cross section 170 illustrated in FIG. 1A), whereas FIG. 2C, FIG. 2E, FIG. 2G, FIG. 2I, FIG. 2K, and FIG. 2M illustrate cross sections of semiconductor structure 100 cut in a vertical direction (e.g. y-direction). Process 200 generally includes formation of cladding layer 220 around active channel 140 before cutting active channel 140 to form a recess during the fabrication process.

Figure 2B:
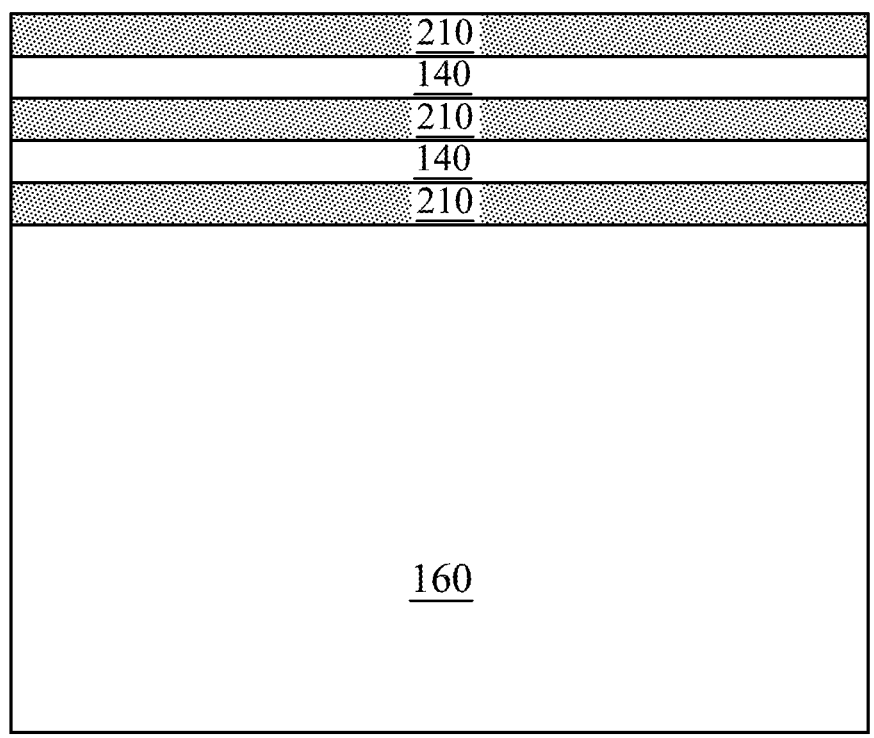
FIGS. 2B-2M illustrate cross sections of the semiconductor structure of FIG. 1A at various steps in the process of FIG. 2A.
Figure 2C:
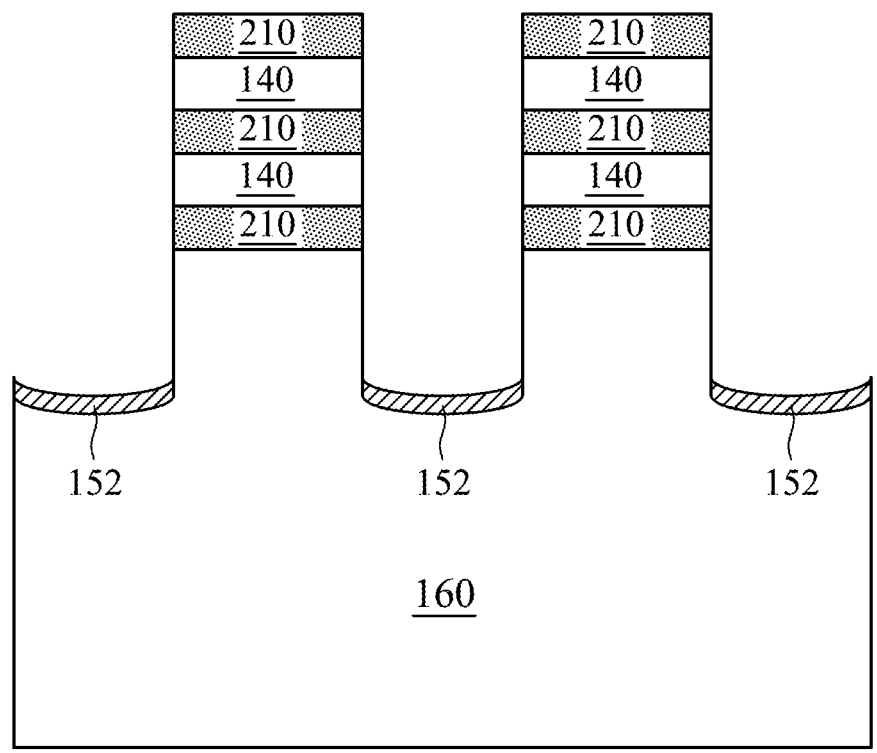

At a step 201, an active channel structure is formed (FIG. 2B and FIG. 2C). As illustrated in FIG. 2B and FIG. 2C, active channels 140 are formed above substrate 160 and between a plurality of sacrificial layers 210. As discussed above, active channels 140 can be implemented as nanostructures (e.g. nanosheets or nanowires) used to form gate-all-around field-effect transistors. Sacrificial layers 210 are used during the fabrication process to separate the active channels 140 during the fabrication process before gate 112 and gate 114 are formed around the active channels 140. Sacrificial layers 210 can be formed using silicon germanium and other suitable materials and combinations thereof. As discussed below, sacrificial layers 210 are ultimately removed.

Figure 2D:
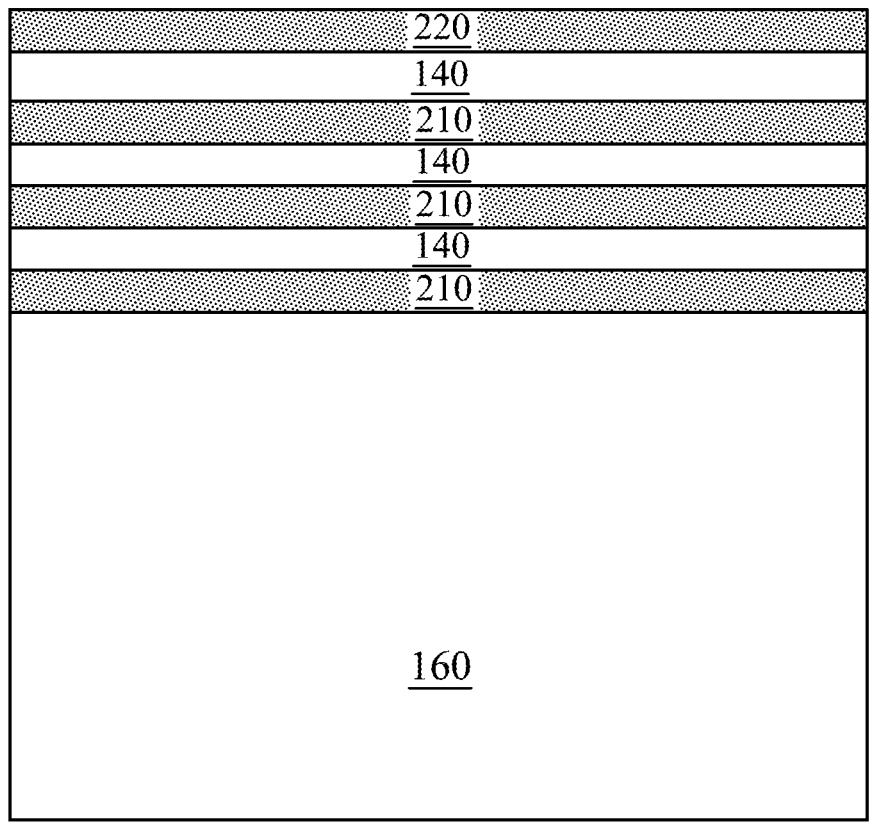
Figure 2E:
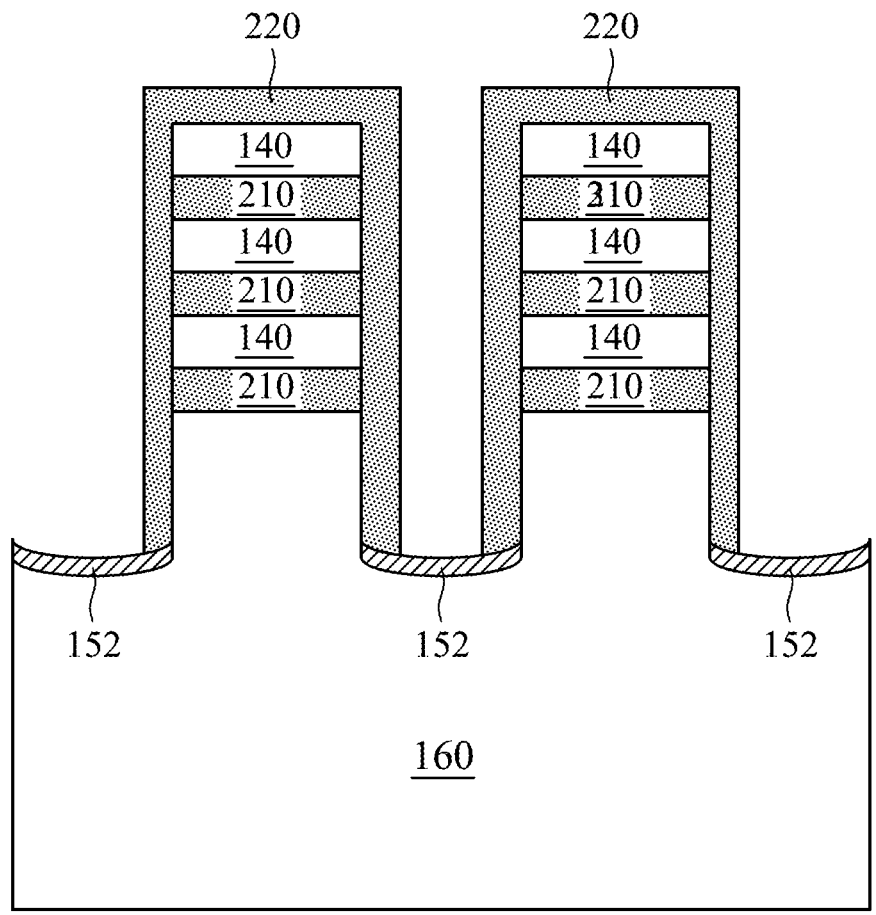

At a step 202, a cladding layer is formed around the active channel structure (FIG. 2D and FIG. 2E). As illustrated in FIG. 2D and FIG. 2E, cladding layer 220 is formed around active channel structures 140. Cladding layer 220 can be formed using epitaxial growth processes such as vapor-phase epitaxy, molecular-beam epitaxy, liquid-phase epitaxy, and other suitable processes and combinations thereof. Cladding layer 220 can be formed of silicon germanium, among other suitable materials and combinations thereof. In implementations where cladding layer 220 and sacrificial layers 210 are both formed of silicon germanium, cladding layer 220 can generally be formed using a higher concentration of germanium. Notably, the formation of cladding layer 220 in step 202 occurs before cutting active channels 140. In step 202, cladding layer 220 is formed around active channels 140 such that cladding layer 220 is formed adjacent a first side of active channels 140, a second side of active channels 140, a third side of active channels 140, and a fourth side of active channels 140.

Figure 2F:
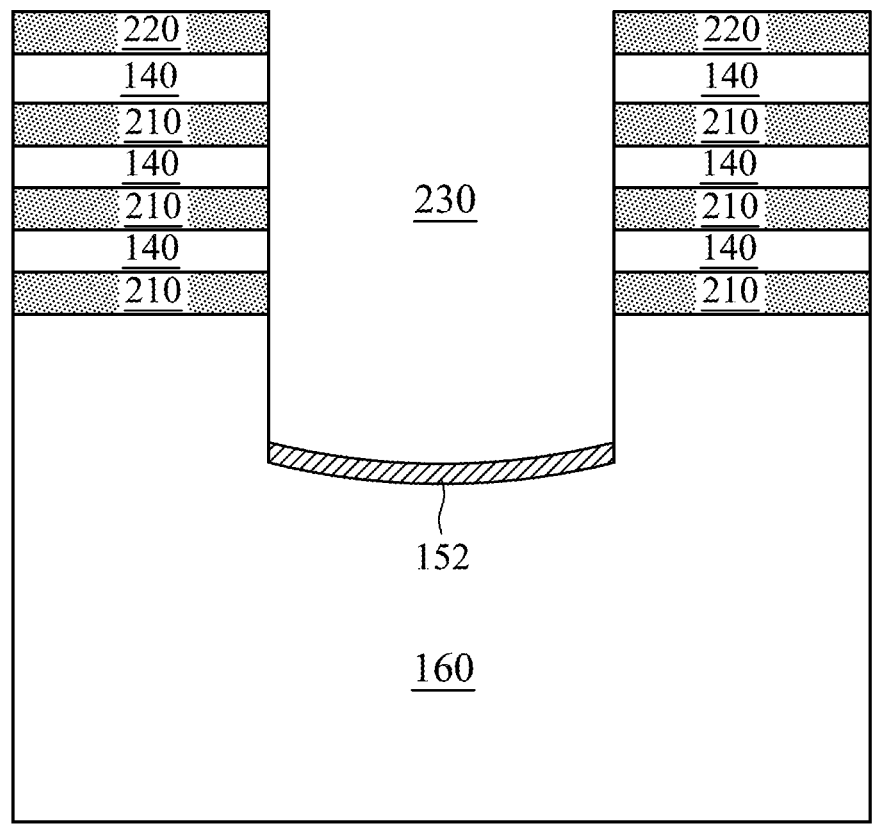
Figure 2G:
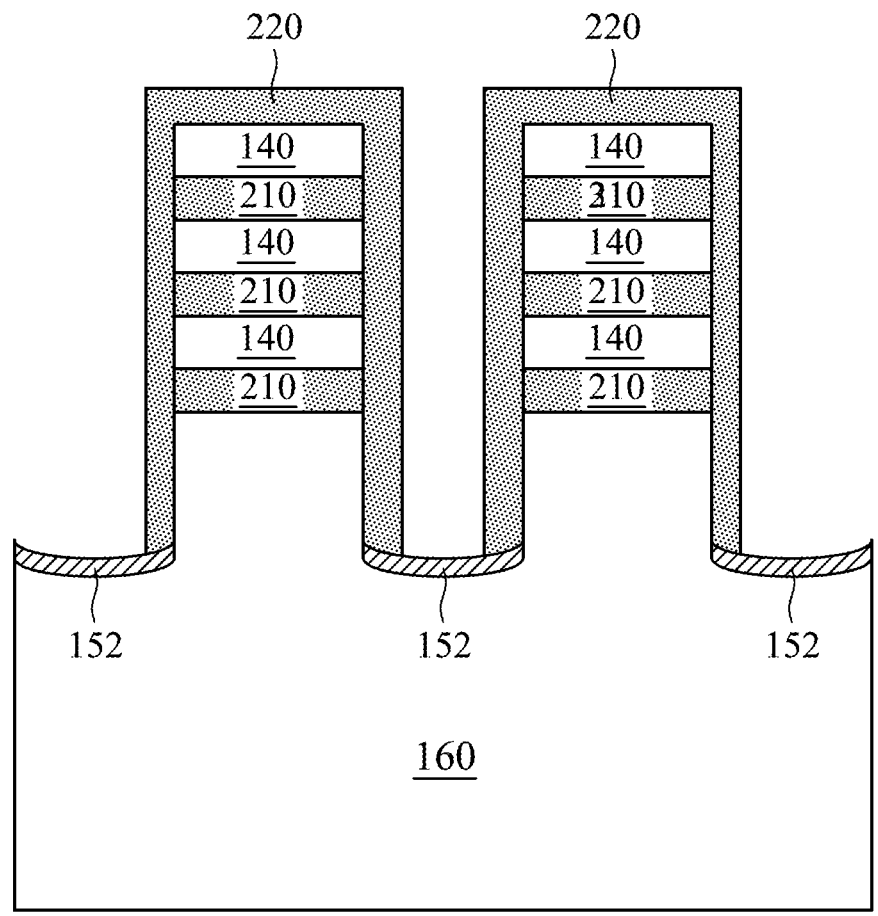

At a step 203, a portion of the active channel structure and a portion of the cladding layer are removed to form a recess (FIG. 2F and FIG. 2G). As illustrated in FIG. 2F and FIG. 2G, portions of active channels 140, sacrificial layers 210, and cladding layer 220 are removed to form a recess 230. The removal processes in step 203 can be formed using one or more etching processes, including both dry etching processes and wet etching processes, as well as reactive ion etching processes and other suitable types of etching processes. Moreover, a variety of different etchant chemicals can be used in step 203 to remove the portions of active channels 140, sacrificial layers 210, and cladding layer 220 to form recess 230. Notably, because cladding layer 220 is formed before the removal process in step 203, cladding layer 220 will only be adjacent the first side of active channels 140, the second side of active channels 140, and the third side of active channels 140, but not the fourth side of active channels 140 as illustrated in FIG. 1C above.

Figure 2H:
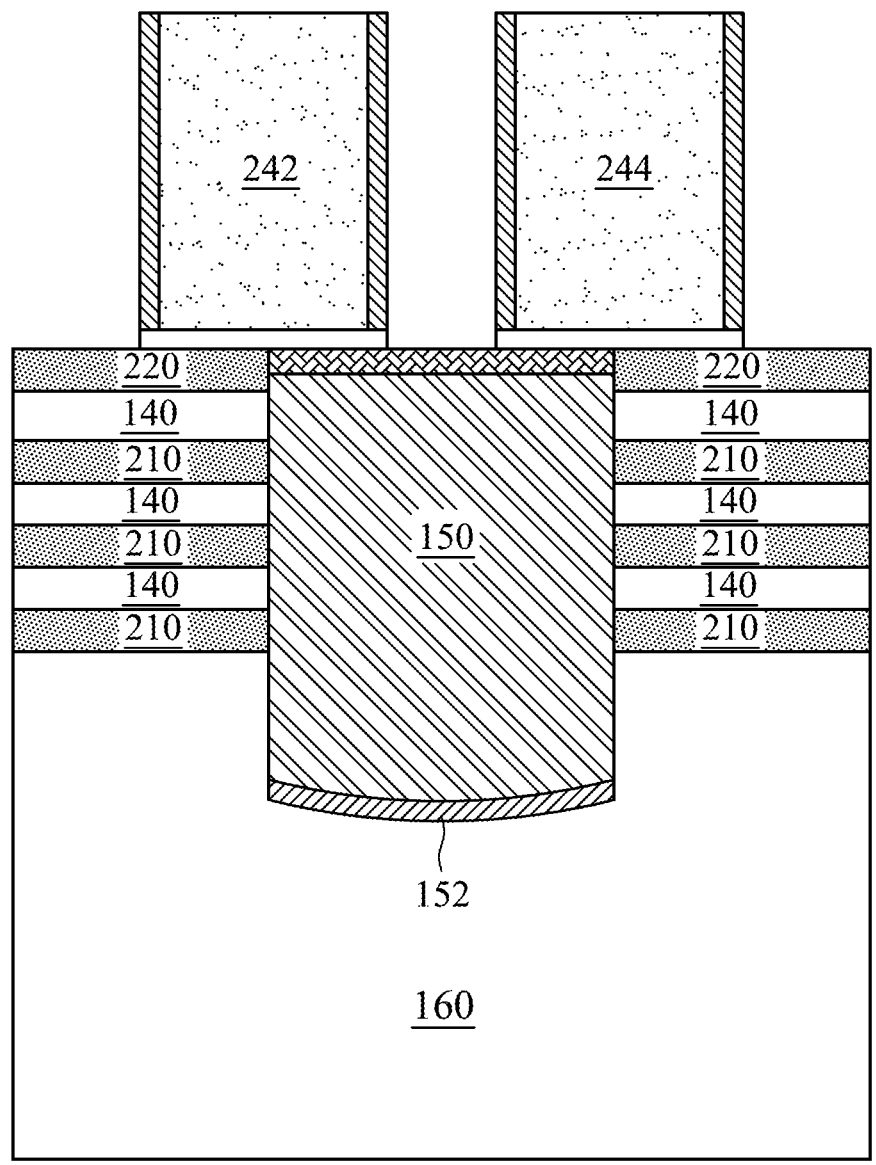
Figure 2I:
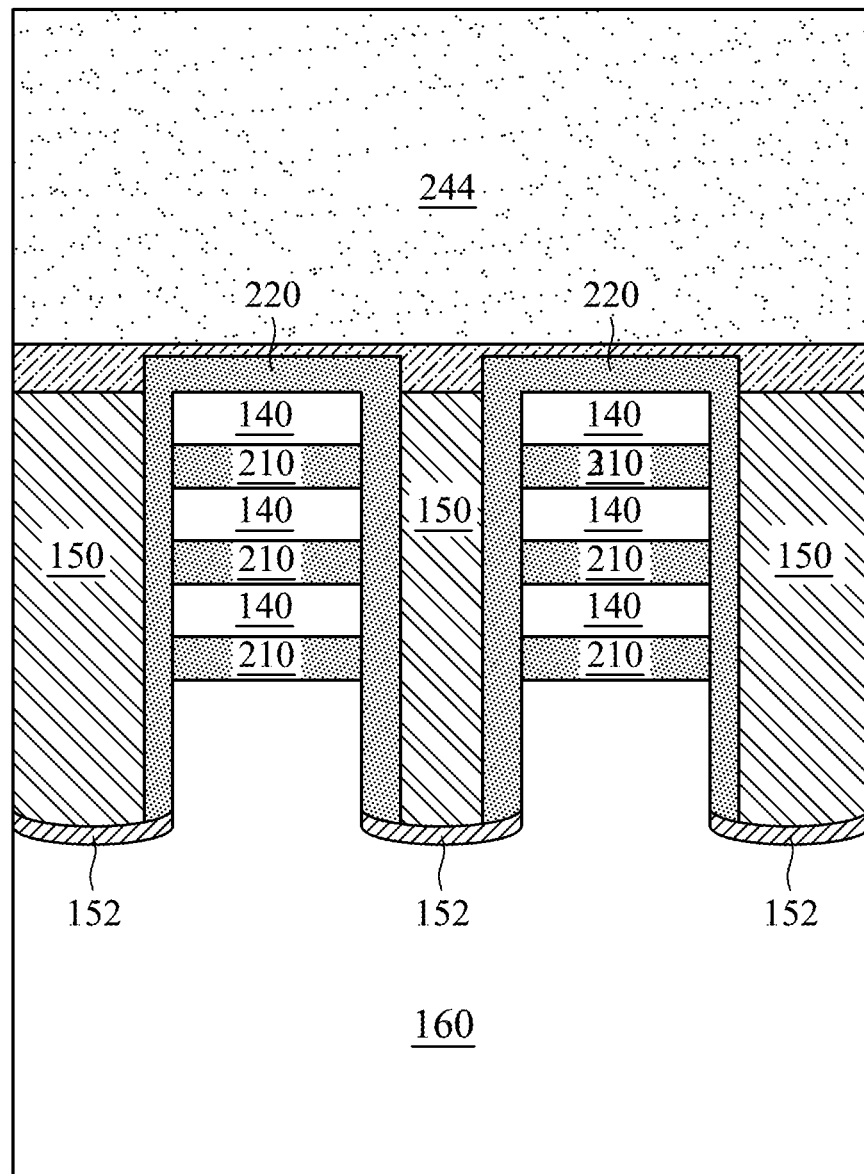

At a step 204, the recess is filled with dielectric material and a dummy gate structure is formed (FIG. 2H and FIG. 2I). As illustrated in FIG. 2H and FIG. 2I, recess 230 is filled with dielectric material to form dielectric region 150. Dielectric region 150 can be formed within recess 230 using deposition processes such as chemical vapor deposition, among other suitable processes and combinations thereof. Next, a dummy gate structure 242 and a dummy gate structure 244 are formed above dielectric region 150 and cladding layer 220. Dummy gate structure 242 and dummy gate structure 244 can be formed using polysilicon, among other suitable materials and combinations thereof. Dummy gate structure 242 and dummy gate structure 244 can be formed using processes such as chemical vapor deposition, among other suitable processes and combinations thereof. Dummy gate structure 242 and dummy gate structure 244 generally serve as placeholders during the fabrication process and are ultimately removed before forming gate 112 and gate 114. It will be appreciated that various materials such as insulating layers and other types of layers can be formed between dummy gate structure 242, dummy gate structure 244, and adjacent structures.

Figure 2J:
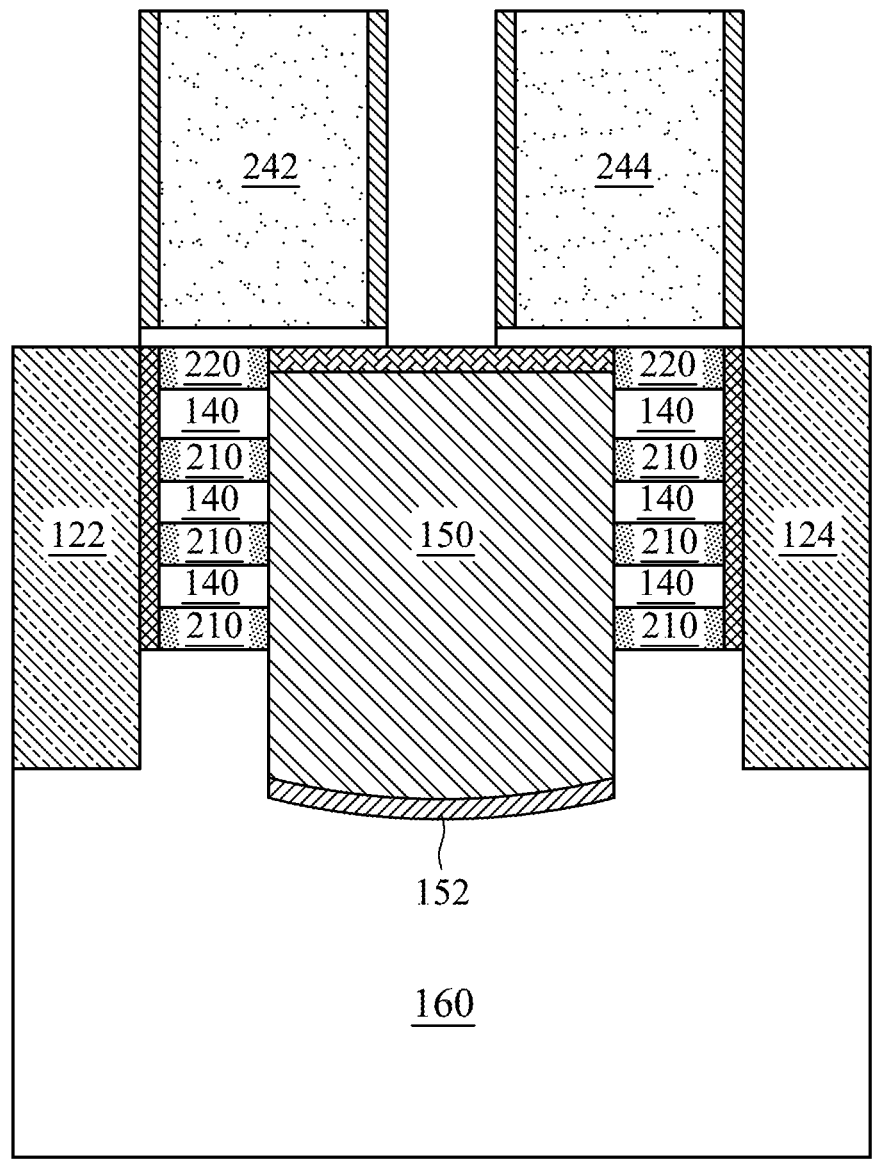
Figure 2K:
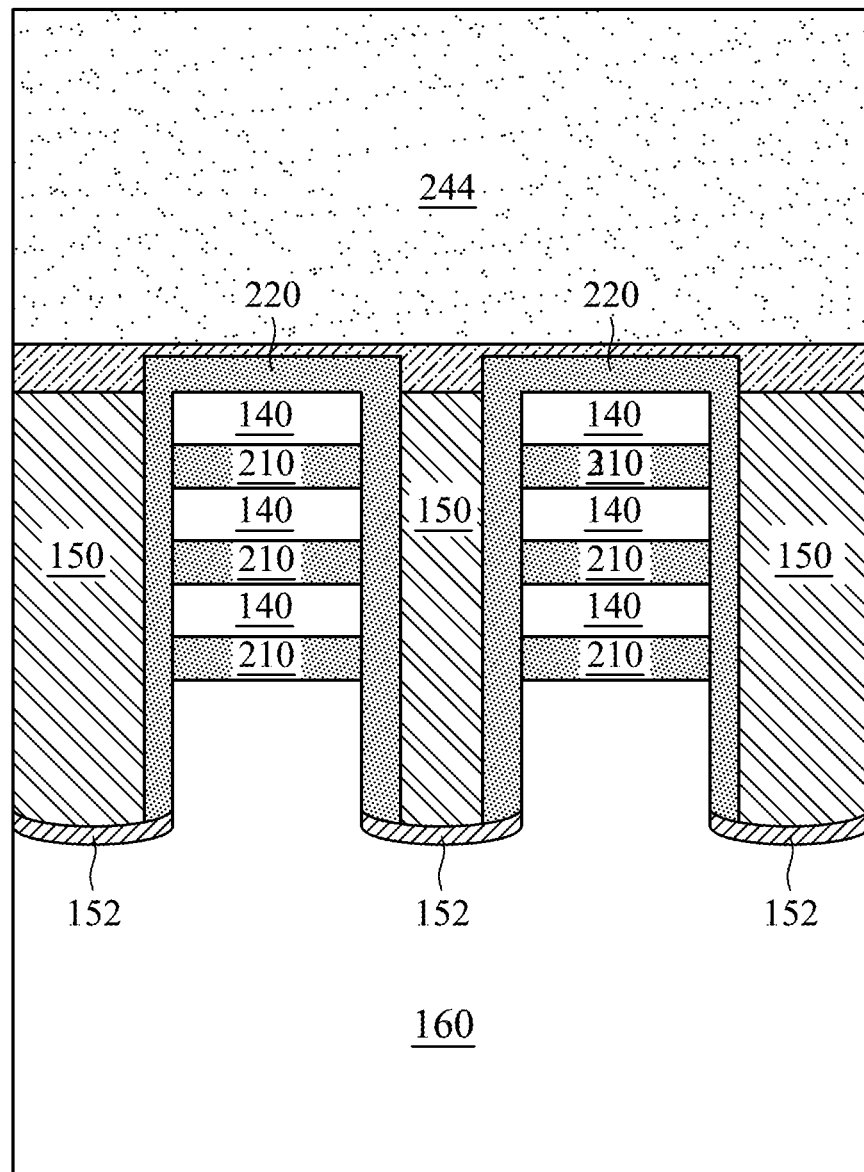

At a step 205, an epitaxial region is formed around the active channel structure (FIG. 2J and FIG. 2K). As illustrated in FIG. 2J, epitaxial region 122 and epitaxial region 124 are formed around active channels 140. As discussed above, epitaxial region 122 and epitaxial region 124 can generally serve as source and drain terminals of transistors. Accordingly, epitaxial region 122 and epitaxial region 124 can be doped using suitable dopants, including both n-type dopants and p-type dopants. Epitaxial region 122 and epitaxial region 124 can be formed using epitaxial growth processes including vapor-phase epitaxy, molecular-beam epitaxy, liquid-phase epitaxy, and other suitable processes and combinations thereof. In some embodiments, portions of sacrificial layers 210 and/or cladding layer 220 are removed using suitable etching processes before formation of epitaxial region 122 and epitaxial region 124.

Figure 2L:
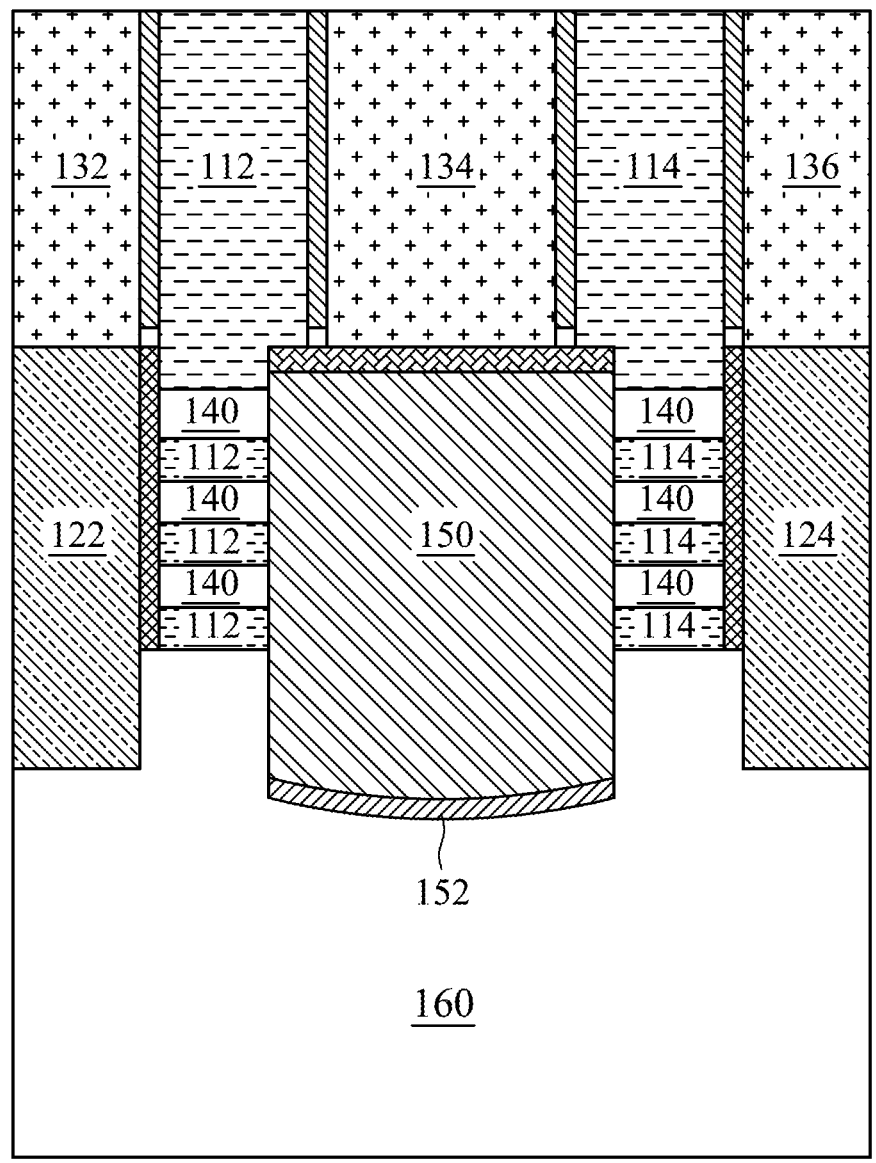
Figure 2M:
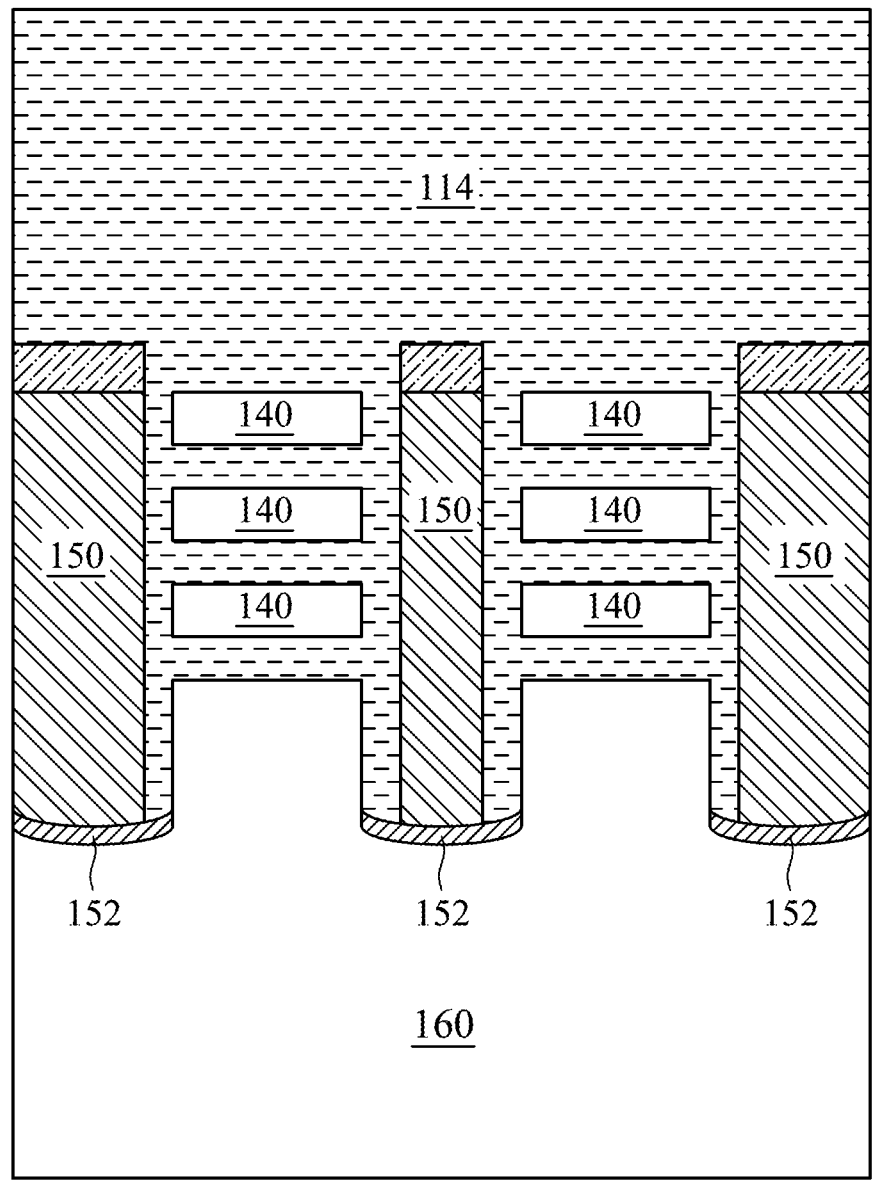

At a step 206, the dummy gate structure is removed and an active gate structure is formed around the active channel structure (FIG. 2L and FIG. 2M). As illustrated in FIG. 2L and FIG. 2M, dummy gate structure 242 and dummy gate structure 244 are removed, along with sacrificial layers 210. These structures can be removed using a variety of suitable etching processes, including both dry etching processes and wet etching processes, as well as reactive ion etching processes and other suitable types of etching processes. Next, gate 112 and gate 114 are formed around active channels 140 to form active gate structures of a transistor. As a result of the selective use of cladding layer 220 in process 200, the process windows for forming gate 112 and gate 114 in step 206 are more consistent, and thereby gate 112 and gate 114 can be formed such that the width of gate 112 is equal to the width of gate 114. These more consistent process windows can help prevent undesirable effects such as overlap shift with respect to dielectric region 150 and other structures. Additionally, in step 206, insulating layer 132, insulating layer 134, and insulating layer 136 can be formed adjacent gate 112 and gate 114. The improved process window attained through the selective use of cladding layer 220 in process 200 can also allow for the width of insulating layer 134 to be greater than the width of gate 112 and the width of gate 114, respectively.

Figure 3A:
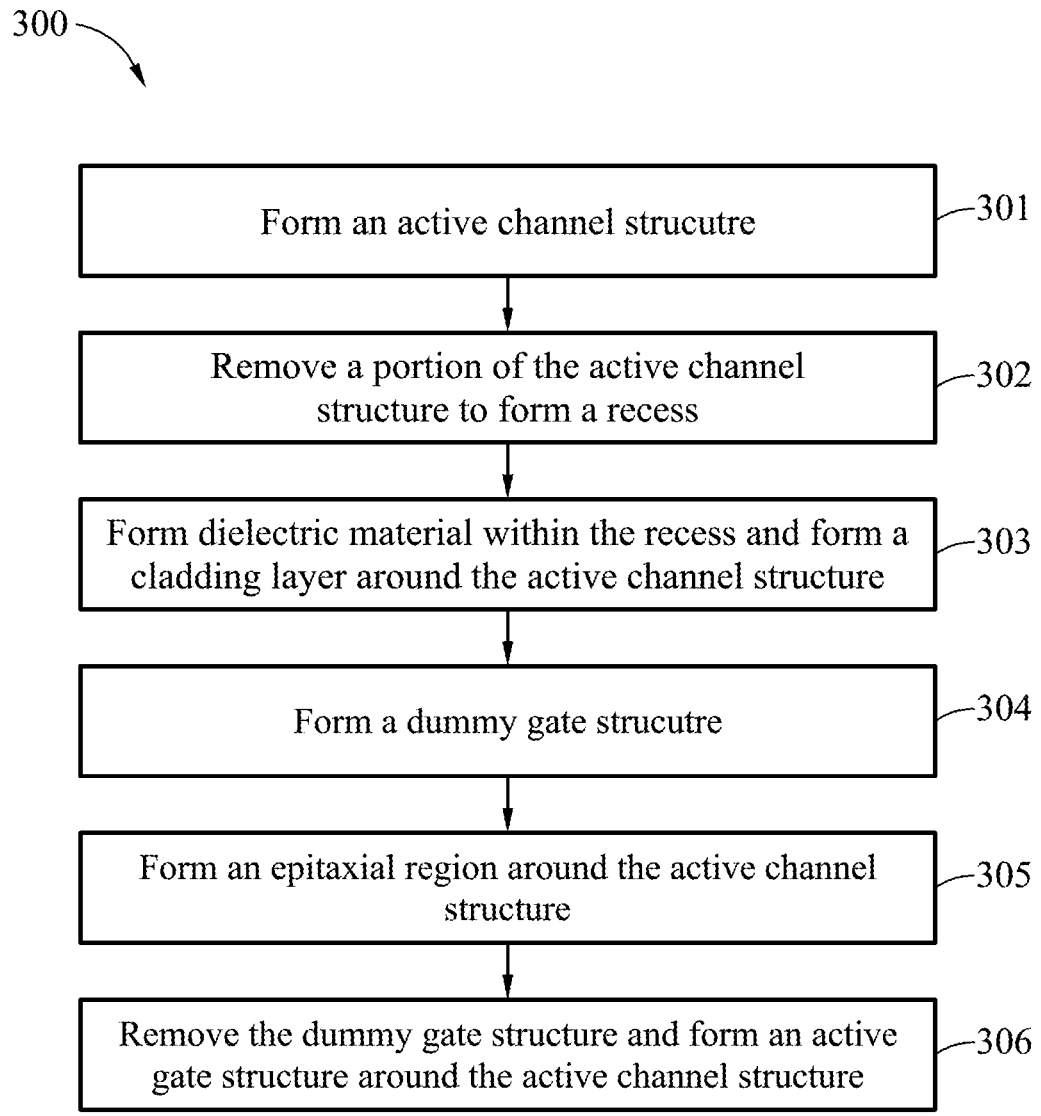
FIG. 3A is a flow diagram illustrating another example process for fabricating the semiconductor structure of FIG. 1A, in accordance with some embodiments.

Referring now to FIG. 3A, a flow diagram illustrating an example process 300 for fabricating semiconductor structure 100 is shown, in accordance with some embodiments. FIGS. 3B-3M illustrate cross sections of semiconductor structure 100 at various steps of process 300. FIG. 3B, FIG. 3D, FIG. 3F, FIG. 3H, FIG. 3J, and FIG. 3L illustrate cross sections of semiconductor structure 100 cut in a horizontal direction (e.g. x-direction as cut from cross section 170 illustrated in FIG. 1A), whereas FIG. 3C, FIG. 3E, FIG. 3G, FIG. 3I, FIG. 3K, and FIG. 3M illustrate cross sections of semiconductor structure 100 cut in a vertical direction (e.g. y-direction). Process 300 generally includes cutting active channel 140 to from a recess and filling the recess with dielectric material before forming cladding layer 330 around active channel 140.

Figure 3B:
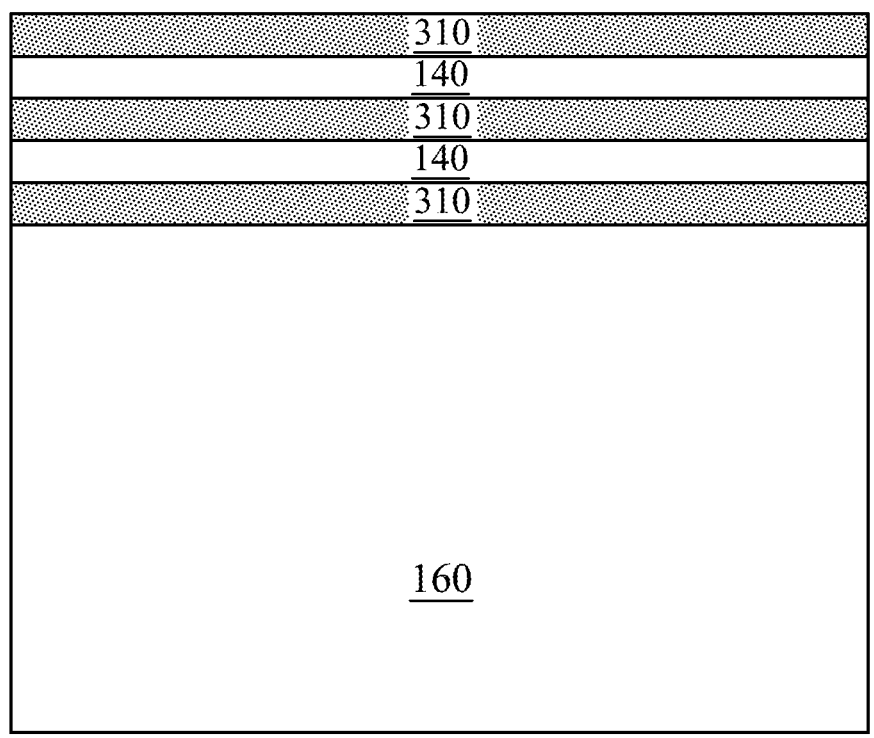
FIGS. 3B-3M illustrate cross sections of the semiconductor structure of FIG. 1A at various steps in the process of FIG. 3A.
Figure 3C:
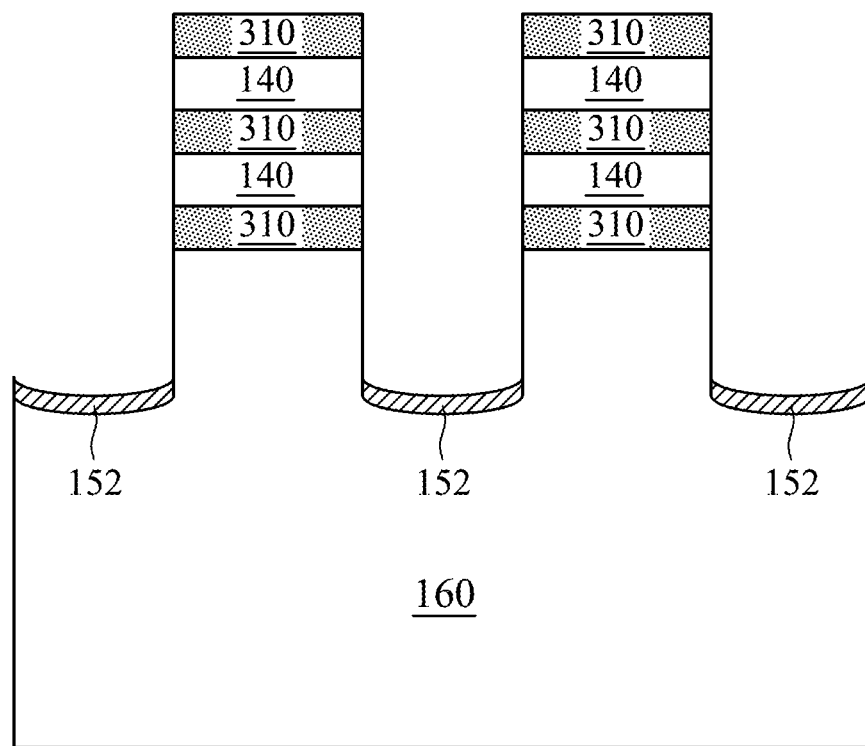

At a step 301, an active channel structure is formed (FIG. 3B and FIG. 3C). As illustrated in FIG. 3B and FIG. 3C, active channels 140 are formed above substrate 160 and between a plurality of sacrificial layers 310. As discussed above, active channels 140 can be implemented as nanosheet structures used to form gate-all-around field-effect transistors. Sacrificial layers 310 are similar to sacrificial layers 210 in the sense that sacrificial layers 310 are used during the fabrication process to separate the active channels 140 during the fabrication process before gate 112 and gate 114 are formed around the active channels 140. Sacrificial layers 310 can be formed using silicon germanium and other suitable materials and combinations thereof. Like sacrificial layers 210, sacrificial layers 310 are ultimately removed.

Figure 3D:
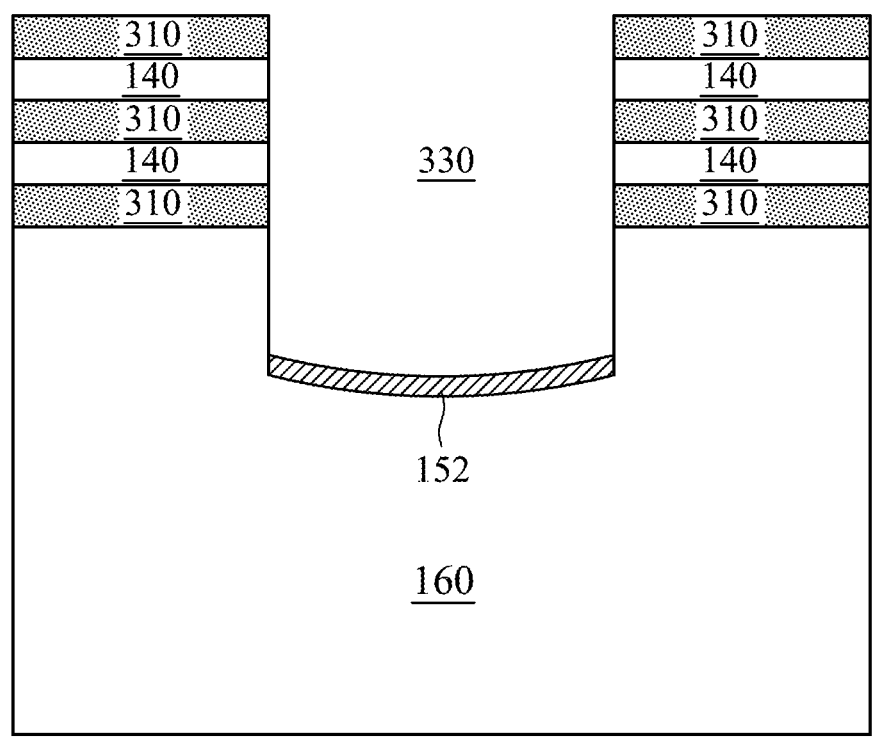
Figure 3E:
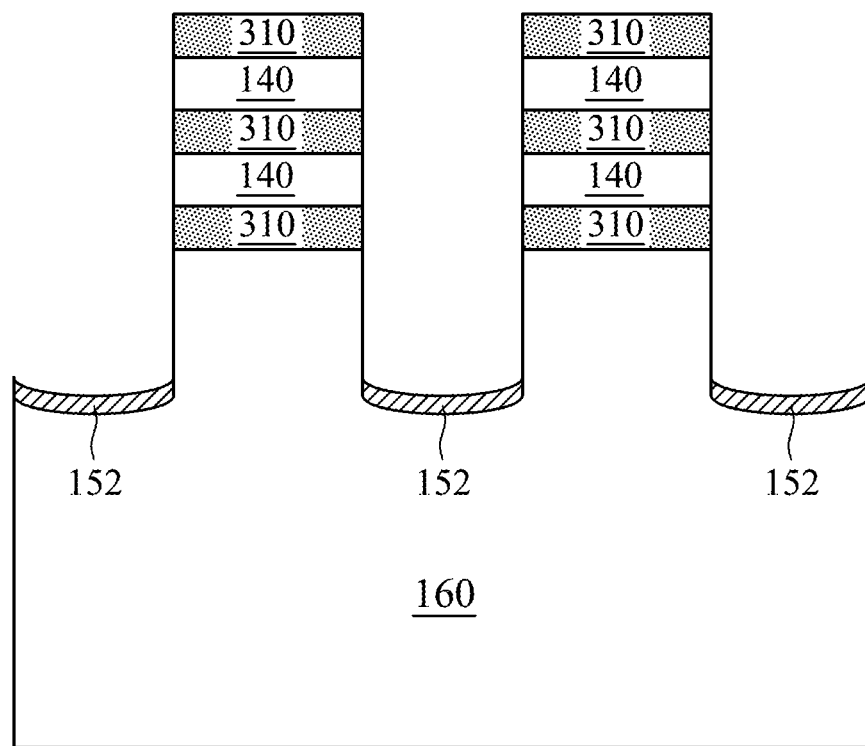

At a step 302, a portion of the active channel structure is removed to form a recess (FIG. 3D and FIG. 3E). As illustrated in FIG. 3D and FIG. 3E, portions of active channels 140 and sacrificial layers 310 are removed to form a recess 330. The removal processes in step 302 can be performed using one or more etching processes, including both dry etching processes and wet etching processes, as well as reactive ion etching processes and other suitable types of etching processes. Moreover, a variety of different etchant chemicals can be used in step 302 to remove the portions of active channels 140 and sacrificial layers 310 to form recess 330. Notably, unlike in process 200, the removal process performed in step 302 of process 300 occurs before formation of cladding layer 320.

Figure 3F:
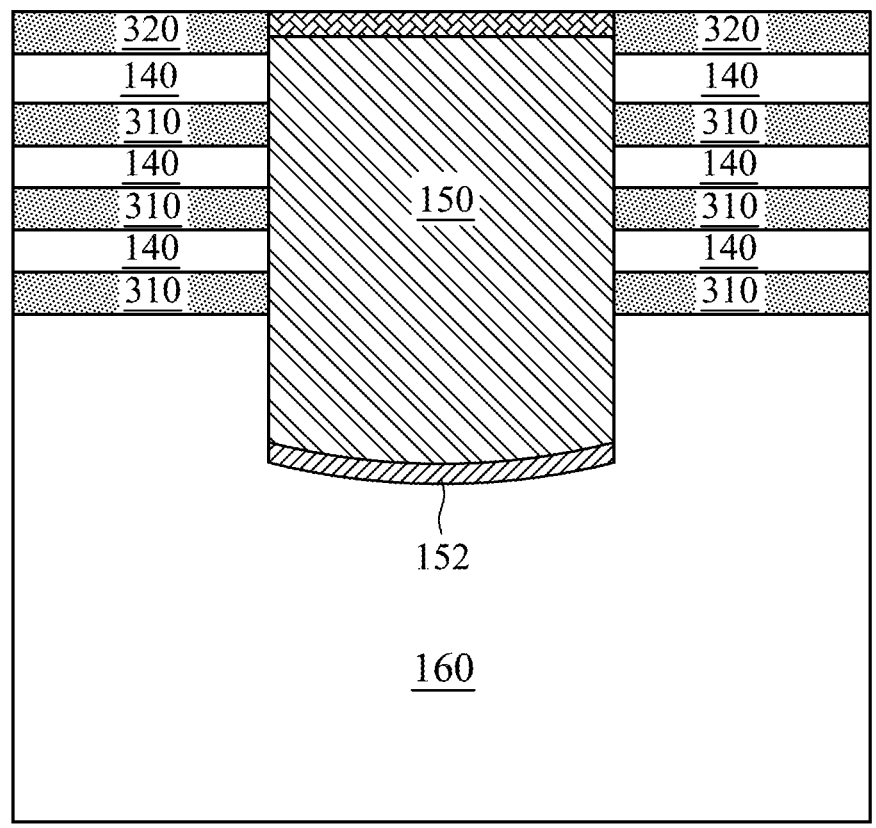
Figure 3G:
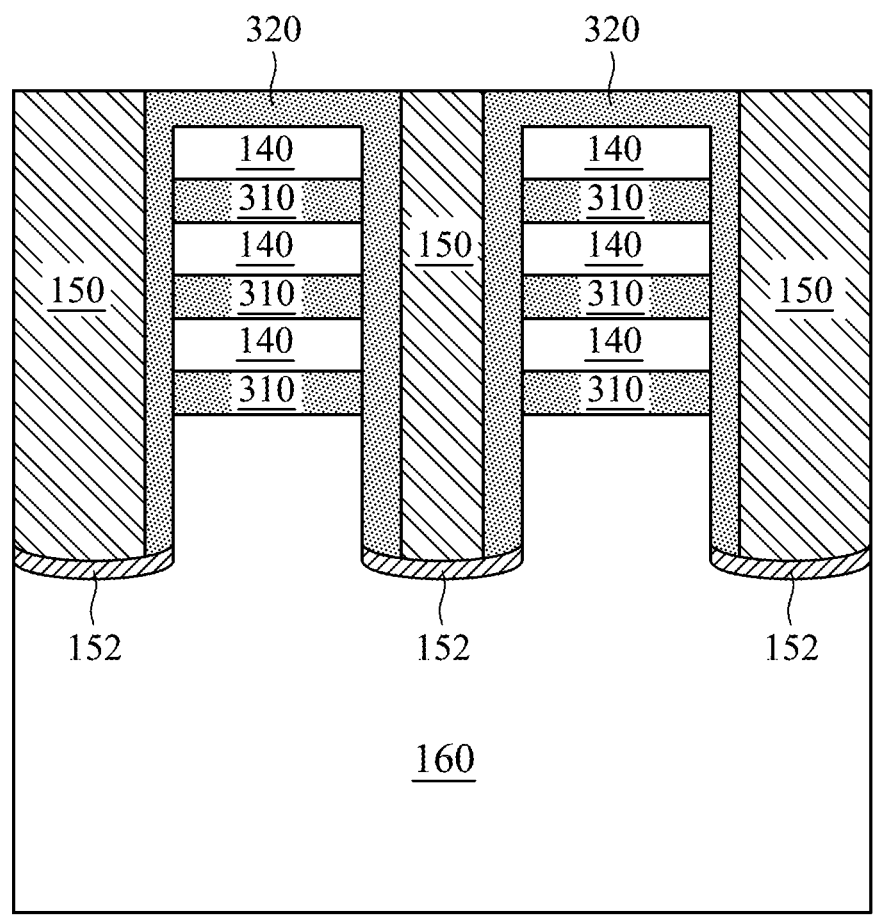

At a step 303, dielectric material is formed within the recess and a cladding layer is formed around the active channel structure (FIG. 3F and FIG. 3G). As illustrated in FIG. 3F and FIG. 3G, dielectric region 150 is formed within recess 330. Dielectric region 150 can be formed within recess 330 using deposition processes such as chemical vapor deposition, among other suitable processes and combinations thereof. Next, cladding layer 320 is formed around active channel structures 140 and dielectric region 150. Cladding layer 320 can be formed using epitaxial growth processes such as vapor-phase epitaxy, molecular-beam epitaxy, liquid-phase epitaxy, and other suitable processes and combinations thereof. Cladding layer 320 can be formed of silicon germanium, among other suitable materials and combinations thereof. In implementations where cladding layer 320 and sacrificial layers 310 are both formed of silicon germanium, cladding layer 320 can generally be formed using a higher concentration of germanium. Notably, because cladding layer 320 is formed using an epitaxial growth process, cladding layer 320 will not grow on dielectric region 150, but it will grow on active channels 140. Accordingly, in step 303, cladding layer 320 is formed around active channels 140 such that cladding layer 320 is formed adjacent a first side of active channels 140, a second side of active channels 140, and a third side of active channels 140, but not a fourth side of active channels 140 due to the presence of dielectric region 150, as illustrated in FIG. 1D above.

Figure 3H:
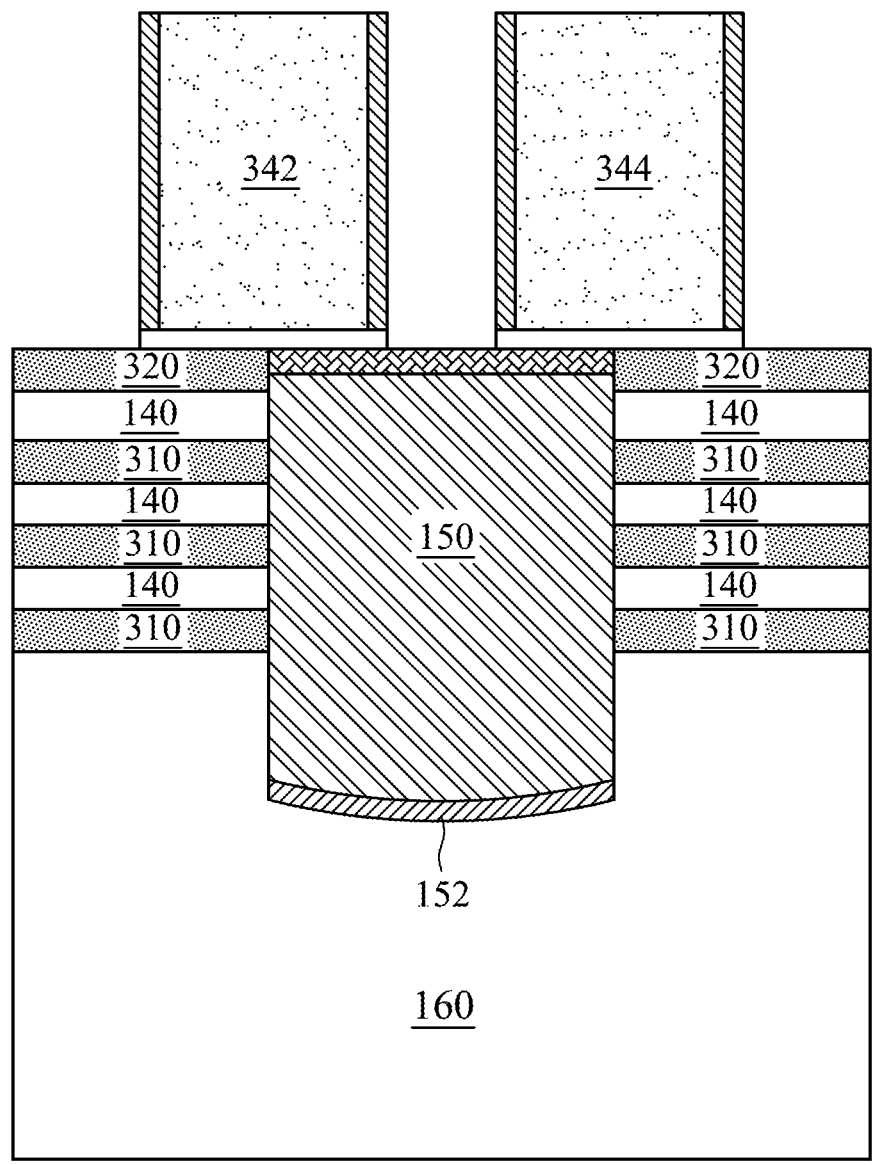
Figure 3I:
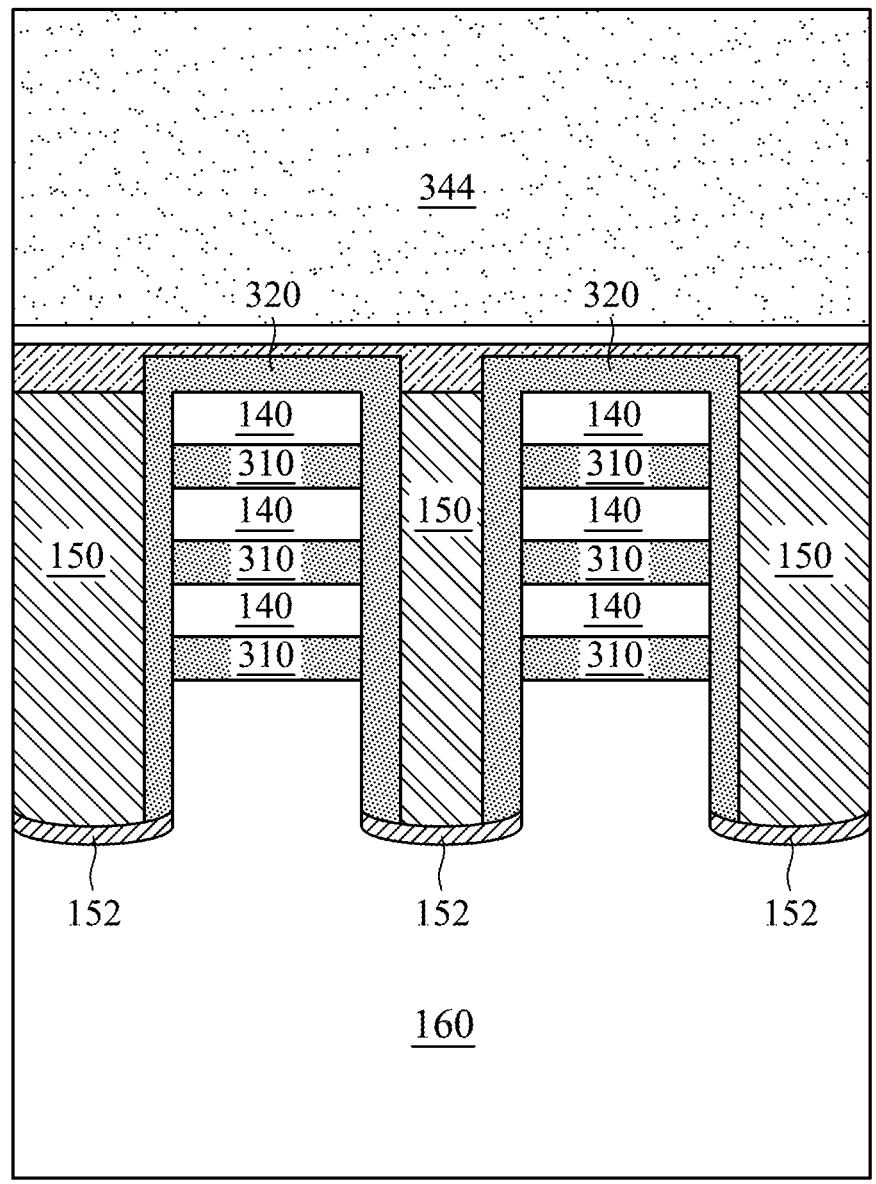

At a step 304, a dummy gate structure is formed (FIG. 3H and FIG. 3I). As illustrated in FIG. 3H and FIG. 3I, a dummy gate structure 342 and a dummy gate structure 344 are formed above dielectric region 150 and cladding layer 320. Dummy gate structure 342 and dummy gate structure 344 can be formed using polysilicon, among other suitable materials and combinations thereof. Dummy gate structure 342 and dummy gate structure 344 can be formed using processes such as chemical vapor deposition, among other suitable processes and combinations thereof. Dummy gate structure 342 and dummy gate structure 344 generally serve as placeholders during the fabrication process and are ultimately removed before forming gate 112 and gate 114. It will be appreciated that various materials such as insulating layers and other types of layers can be formed between dummy gate structure 342, dummy gate structure 344, and adjacent structures.

Figure 3J:
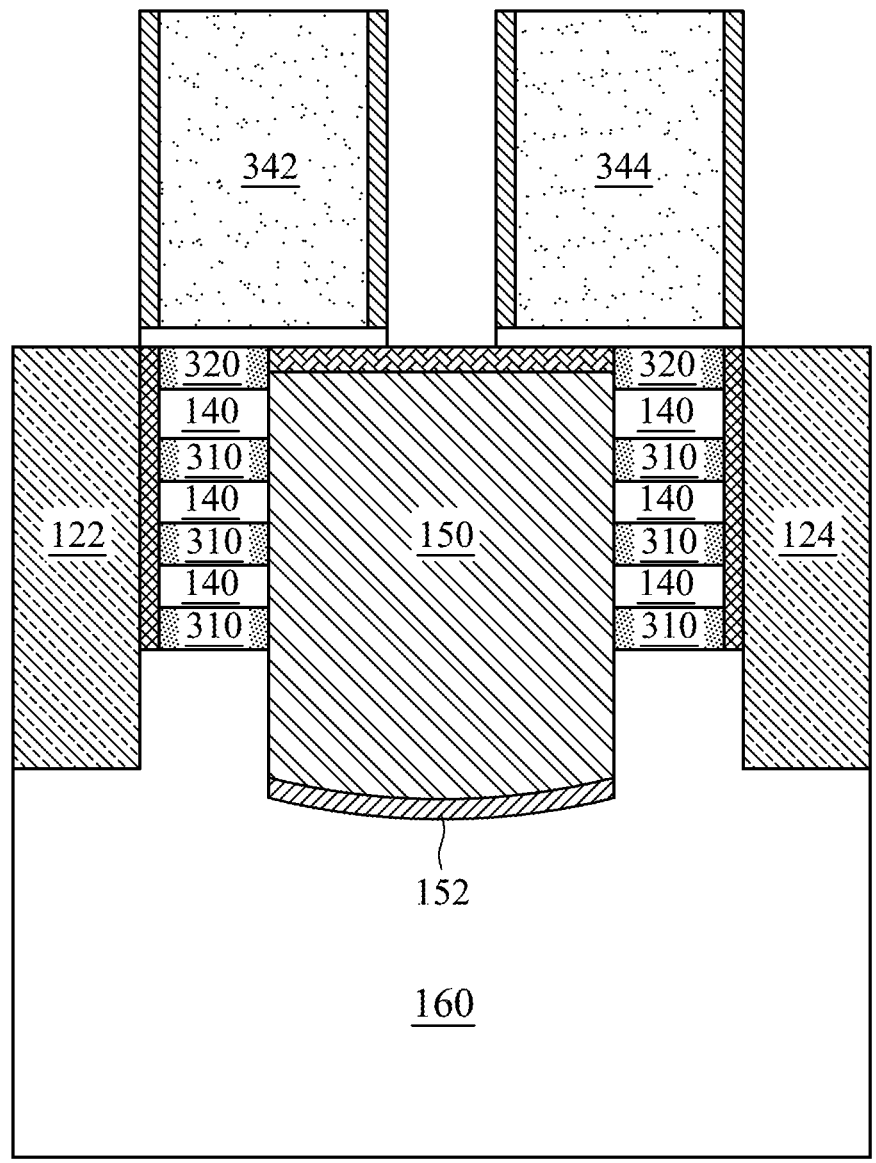
Figure 3K:
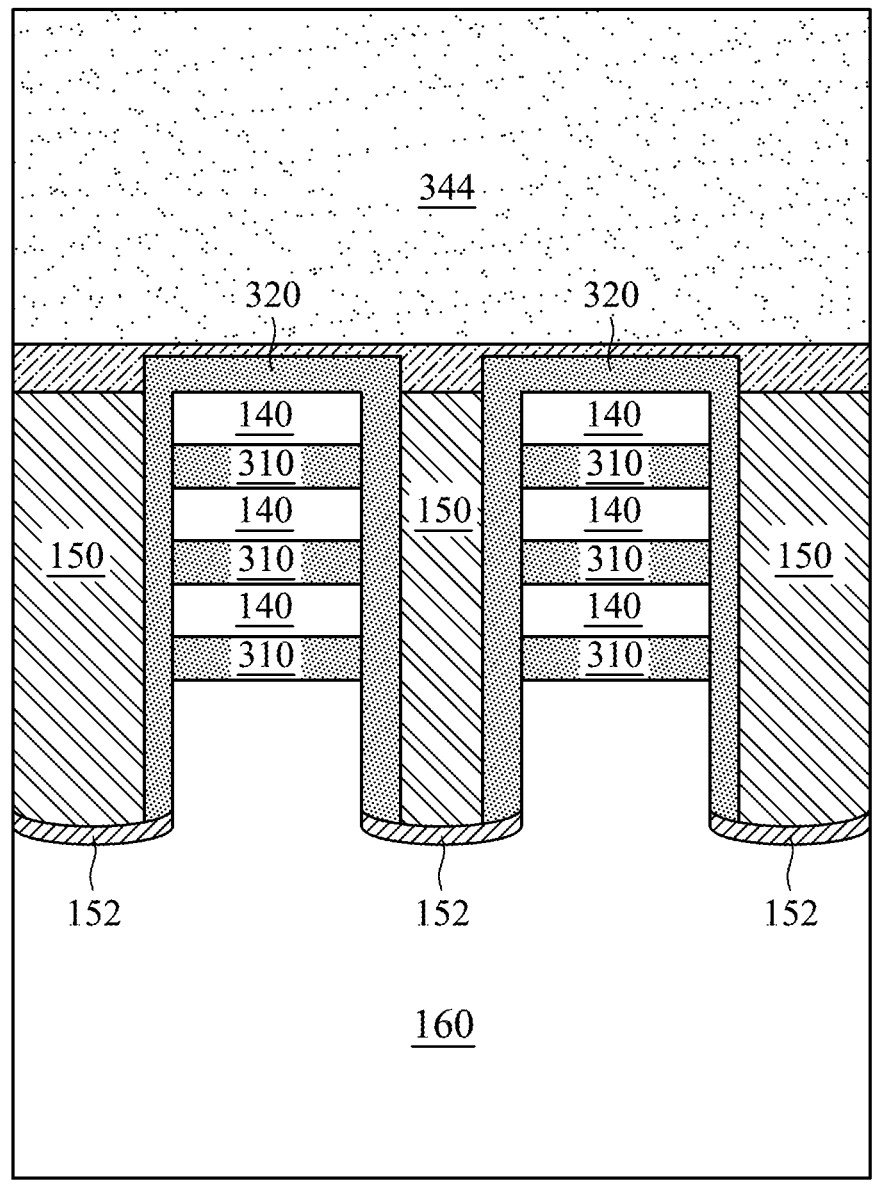

At a step 305, an epitaxial region is formed around the active channel structure (FIG. 3J and FIG. 3K). As illustrated in FIG. 3J, epitaxial region 122 and epitaxial region 124 are formed around active channels 140. Epitaxial region 122 and epitaxial region 124 can generally serve as source and train terminals of a transistor. Accordingly, epitaxial region 122 and epitaxial region 124 can be doped using suitable dopants, including both n-type dopants and p-type dopants. Epitaxial region 122 and epitaxial region 124 can be formed using epitaxial growth processes including vapor-phase epitaxy, molecular-beam epitaxy, liquid-phase epitaxy, and other suitable processes and combinations thereof.

In some embodiments, portions of sacrificial layers 310 and/or cladding layer 320 are removed using suitable etching processes before formation of epitaxial region 122 and epitaxial region 124.

Figure 3L:
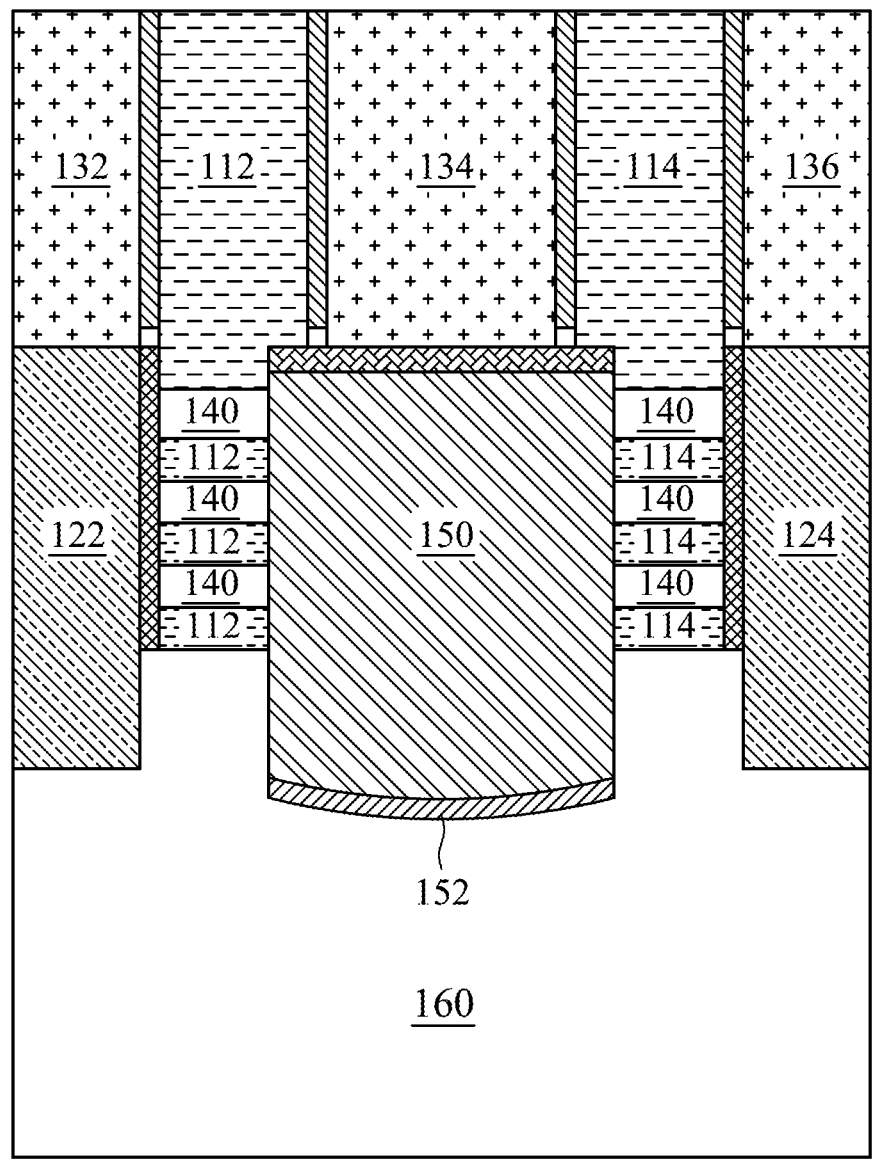
Figure 3M:
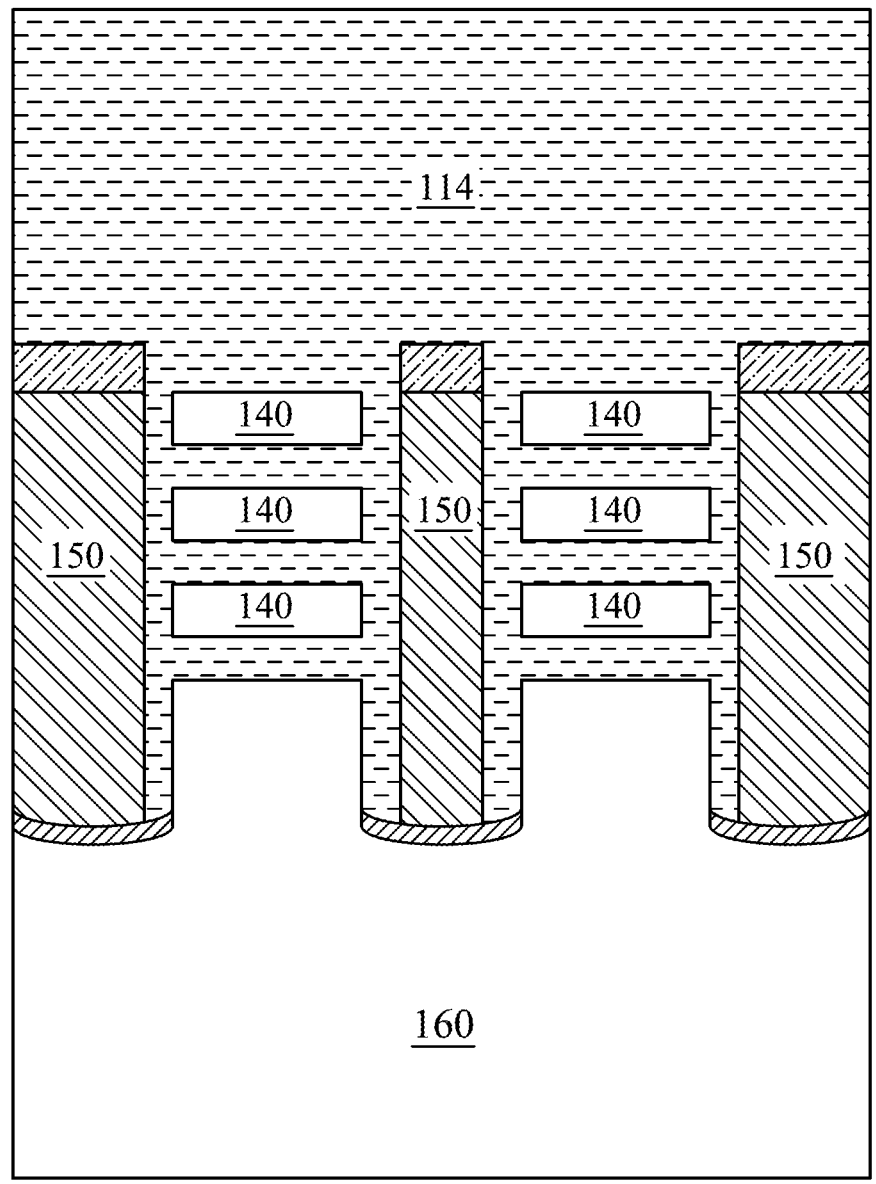

At a step 306, the dummy gate structure is removed and an active gate structure is formed around the active channel structure (FIG. 3L and FIG. 3M). As illustrated in FIG. 3L and FIG. 3M, dummy gate structure 342 and dummy gate structure 344 are removed, along with sacrificial layers 310. These structures can be removed using a variety of suitable etching processes, including both dry etching processes and wet etching processes, as well as reactive ion etching processes and other suitable types of etching processes. Next, gate 112 and gate 114 are formed around active channels 140 to form active gate structures of a transistor. As a result of the selective use of cladding layer 320 in process 300, the process windows for forming gate 112 and gate 114 in step 306 are more consistent, and thereby gate 112 and gate 114 can be formed such that the width of gate 112 is equal to the width of gate 114. These more consistent process windows can help prevent undesirable effects such as overlap shift with respect to dielectric region 150 and other structures. Additionally, in step 306, insulating layer 132, insulating layer 134, and insulating layer 136 can be formed adjacent gate 112 and gate 114. The improved process window attained through the selective use of cladding layer 320 in process 300 can also allow for the width of insulating layer 134 to be greater than the width of gate 112 and the width of gate 114, respectively.

It will be appreciated that process 200 and process 300 as described above are provided as examples, and various adaptions to process 200 and process 300 are contemplated within the scope of the present disclosure.

As described in detail above, the present disclosure provides techniques for providing critical dimension uniformity in semiconductor structures such as gate-all-around field-effect transistor (GAAFET) structures through elective use of a cladding layer. The cladding layer can be formed before forming a recess in an active channel structure or can be formed after filling a recess in an active channel structure with dielectric material. The cladding layer can be selectively used to provide consistent and larger process windows for forming gate structures in an integrated circuit.

An implementation of the present disclosure is a method of fabricating a semiconductor structure. The method includes removing a portion of an active channel structure to form a recess, filling the recess with dielectric material, forming a cladding layer adjacent the active channel structure but not adjacent the dielectric material, forming a cladding layer adjacent the active channel structure but not adjacent the dielectric material, and forming a gate structure around the active channel structure.

Another implementation of the present disclosure is another method of fabricating a semiconductor structure. The method includes forming a cladding layer adjacent a first side, a second side, a third side, and a fourth side of an active channel structure, forming a recess by removing a portion of the cladding layer and a portion of the active channel structure such that after forming the recess the cladding layer is adjacent the first side, the second side, and the third side of the active channel structure, but not adjacent the fourth side of the active channel structure, filling the recess with dielectric material, and forming a gate structure around the active channel structure.

Yet another implementation of the present disclosure is yet another method of fabricating a semiconductor structure. The method includes forming a cladding layer around an active channel structure, removing a portion of the cladding layer and a portion of the active channel structure after forming the cladding layer around the active channel structure, forming a gate structure around the active channel structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor structure, comprising:
   removing a portion of an active channel structure to form a recess;
   filling the recess with dielectric material;
   forming a cladding layer adjacent the active channel structure but not adjacent the dielectric material;
   forming a gate structure around the active channel structure, wherein the gate structure comprises an active gate structure;
   forming a dummy gate structure around the active channel structure; and
   removing the dummy gate structure before forming the active gate structure.

2. The method of claim 1, wherein forming the cladding layer comprises forming a layer of silicon germanium adjacent the active channel structure but not adjacent the dielectric material.

3. The method of claim 1, wherein forming the cladding layer comprises forming the cladding layer using an epitaxial growth process.

4. The method of claim 1, wherein the gate structure comprises a first gate structure, the method further comprising forming a second gate structure around the active channel structure such that a width of the first gate structure is equal to a width of the second gate structure.

5. The method of claim 1, further comprising forming an epitaxial region around the active channel structure.

6. The method of claim 1, further comprising removing a portion of an isolation structure adjacent the active channel structure before forming the cladding layer adjacent the active channel structure.

7. The method of claim 1, wherein forming the cladding layer comprises forming a layer of silicon germanium adjacent the active channel structure.

8. A method of fabricating a semiconductor structure, comprising:
   forming a cladding layer adjacent a first side, a second side, a third side, and a fourth side of an active channel structure;
   forming a recess by removing a portion of the cladding layer and a portion of the active channel structure such that after forming the recess the cladding layer is adjacent the first side, the second side, and the third side of the active channel structure, but not adjacent the fourth side of the active channel structure;
   filling the recess with dielectric material; and
   forming a gate structure around the active channel structure,
   wherein forming the cladding layer comprises forming a layer of silicon germanium adjacent the first side, the second side, the third side, and the fourth side of the active channel structure.

9. The method of claim 8, further comprising forming an epitaxial region around the active channel structure.

10. The method of claim 8, wherein the gate structure comprises an active gate structure, the method further comprising:
    forming a dummy gate structure around the active channel structure; and
    removing the dummy gate structure before forming the active gate structure.

11. The method of claim 8, wherein the gate structure comprises a first gate structure, the method further comprising forming a second gate structure around the active channel structure such that a width of the first gate structure is equal to a width of the second gate structure.

12. The method of claim 11, wherein filling the recess with dielectric material comprises filling the recess with dielectric material such that a width of the dielectric material is greater than the width of the first gate structure and the width of the second gate structure.

13. The method of claim 8, wherein forming the cladding layer comprises forming the cladding layer using an epitaxial growth process.

14. The method of claim 8, wherein forming the cladding layer comprises forming a layer of silicon germanium adjacent the active channel structure.

15. A method of fabricating a semiconductor structure, comprising:
    forming a cladding layer around an active channel structure;
    removing a portion of the cladding layer and a portion of the active channel structure after forming the cladding layer around the active channel structure;
    forming a gate structure around the active channel structure, wherein the gate structure comprises an active gate structure;
    forming a dummy gate structure around the active channel structure; and
    removing the dummy gate structure before forming the active gate structure.

16. The method of claim 15, wherein forming the cladding layer comprises growing the cladding layer around the active channel structure using an epitaxial growth process.

17. The method of claim 15, wherein removing the portion of the cladding layer and the portion of the active channel structure comprises removing the portion of the cladding layer and the portion of the active channel structure to form a recess, the method further comprising forming dielectric material within the recess.

18. The method of claim 15, further comprising forming an epitaxial region around the active channel structure.

19. The method of claim 15, wherein the gate structure comprises a first gate structure, the method further comprising forming a second gate structure around the active channel structure such that a width of the first gate structure is equal to a width of the second gate structure.

20. The method of claim 15, wherein forming the cladding layer comprises forming a layer of silicon germanium adjacent the active channel structure.

* * * * *